(12) United States Patent
Pfnuer et al.

(10) Patent No.: US 9,755,752 B2
(45) Date of Patent: Sep. 5, 2017

(54) METHOD FOR MANUFACTURING AN OPTICAL COMMUNICATION DEVICE

(71) Applicant: Cisco Technology, Inc., San Jose, CA (US)

(72) Inventors: Stefan Pfnuer, San Jose, CA (US); Ravi Kachru, San Jose, CA (US); John Fangman, Leesport, PA (US); Utpal Chakrabarti, Allentown, PA (US)

(73) Assignee: Cisco Technology, Inc., San Jose, CA (US)

( * ) Notice: Subject to any disclaimer, the term of this patent is extended or adjusted under 35 U.S.C. 154(b) by 506 days.

(21) Appl. No.: 14/153,494

(22) Filed: Jan. 13, 2014

(65) Prior Publication Data

US 2015/0121683 A1 May 7, 2015

Related U.S. Application Data

(63) Continuation of application No. 14/072,182, filed on Nov. 5, 2013, now Pat. No. 9,628,184.

(51) Int. Cl.
| | |
|---|---|
| *H04B 10/50* | (2013.01) |
| *G02B 6/42* | (2006.01) |
| *H05K 13/00* | (2006.01) |
| *H01L 33/64* | (2010.01) |

(Continued)

(52) U.S. Cl.
CPC ......... *H04B 10/503* (2013.01); *G02B 6/4208* (2013.01); *G02B 6/4236* (2013.01);
(Continued)

(58) Field of Classification Search
CPC .. G02B 6/4208; G02B 6/4236; G02B 6/4249; G02B 6/4251; G02B 6/4271;
(Continued)

(56) References Cited

U.S. PATENT DOCUMENTS

| | | | | |
|---|---|---|---|---|
| 4,358,717 A | | 11/1982 | Elliott | |
| 4,839,961 A | * | 6/1989 | Vermeer | ............... 29/740 |

(Continued)

FOREIGN PATENT DOCUMENTS

| | | |
|---|---|---|
| CN | 102052608 | 5/2011 |
| CN | 102385124 | 3/2012 |

(Continued)

OTHER PUBLICATIONS

International Search Report and Written Opinion, dated Aug. 11, 2015, received in connection with corresponding International Patent Application No. PCT/US2014/064139.

(Continued)

*Primary Examiner* — A. Dexter Tugbang
(74) *Attorney, Agent, or Firm* — Meunier Carlin & Curfman LLC

(57) ABSTRACT

A method of manufacturing an optical communication device aligns an optical sub-assembly and an optical modulator on a carrier wafer. A first sub-mount supports the optical sub-assembly and a second sub-mount supports the optical modulator. Pre-defined break lines are placed on the carrier wafer to accommodate separation of the sub-assembly and the optical modulator. The first sub-mount connects the optical sub-assembly to a thermoelectric cooler by either an epoxy, a spacer layer, or both. The optical sub-assembly is aligned in the x/y/z directions relative to the second sub-mount in a position to match an optical height of the optical modulator in the z-direction, wherein the z-direction is a vertical direction relative to the carrier wafer.

11 Claims, 36 Drawing Sheets

(51) Int. Cl.
*H01L 33/52* (2010.01)
*H01S 5/022* (2006.01)
*H01S 5/024* (2006.01)
*H01S 5/02* (2006.01)
*H01S 5/026* (2006.01)

(52) U.S. Cl.
CPC ......... *G02B 6/4249* (2013.01); *G02B 6/4251* (2013.01); *G02B 6/4271* (2013.01); *H01L 33/52* (2013.01); *H01L 33/64* (2013.01); *H05K 13/00* (2013.01); *H01S 5/02* (2013.01); *H01S 5/0265* (2013.01); *H01S 5/02236* (2013.01); *H01S 5/02288* (2013.01); *H01S 5/02415* (2013.01); *Y10T 29/49002* (2015.01); *Y10T 29/4913* (2015.01); *Y10T 29/49126* (2015.01); *Y10T 29/49778* (2015.01); *Y10T 29/49815* (2015.01); *Y10T 29/49826* (2015.01); *Y10T 29/53174* (2015.01); *Y10T 29/53178* (2015.01)

(58) Field of Classification Search
CPC ....... H04B 10/503; H01L 33/52; H01L 33/64; H05K 13/00; H01S 5/02236; H01S 5/02288; H01S 5/02415; H01S 5/0265; H01S 5/02; Y10T 29/49002; Y10T 29/49126; Y10T 29/4913; Y10T 29/49778; Y10T 29/49815; Y10T 29/49826; Y10T 29/53174; Y10T 29/53178
See application file for complete search history.

(56) References Cited

U.S. PATENT DOCUMENTS

| | | | |
|---|---|---|---|
| 5,420,868 A | 5/1995 | Chraplyvy et al. | |
| 5,888,841 A | 3/1999 | Synder | |
| 6,588,949 B1* | 7/2003 | Zhou | H01S 5/02288 372/107 |
| 6,965,622 B1 | 11/2005 | Cho et al. | |
| 7,090,412 B2 | 8/2006 | Kato et al. | |
| 7,146,082 B2* | 12/2006 | Zbinden | G02B 6/4208 385/50 |
| 8,724,668 B2 | 5/2014 | Yabe et al. | |
| 2003/0152338 A1* | 8/2003 | Kuhara | G02B 6/4249 385/89 |
| 2004/0076384 A1 | 4/2004 | Kato et al. | |
| 2005/0023548 A1* | 2/2005 | Bhat | H01L 33/64 257/99 |
| 2005/0129374 A1 | 6/2005 | Zbinden | |
| 2005/0207458 A1* | 9/2005 | Zheng | H01S 5/02415 372/34 |
| 2005/0286909 A1 | 12/2005 | Kish et al. | |
| 2006/0152406 A1 | 7/2006 | Leblanc et al. | |

FOREIGN PATENT DOCUMENTS

| | | | |
|---|---|---|---|
| EP | 0467359 | | 1/1992 |
| JP | 2008041158 A | * | 2/2008 |
| WO | 99/42879 | | 8/1999 |

OTHER PUBLICATIONS

Office Action, dated Nov. 11, 2016, received in connection with CN Patent Application No. 201480060533.7.
Article on Silicon, retrieved from Wikipedia.com Internet Archive https//web.archive.org/web/20121011122452/https://en.wikipedia.org/wiki/Silicon, 2012, 9 pages.
International Preliminary Report on Patentability and Written Opinion, dated May 10, 2016, received in connection with corresponding International Patent Application No. PCT/US2014/064139.

* cited by examiner

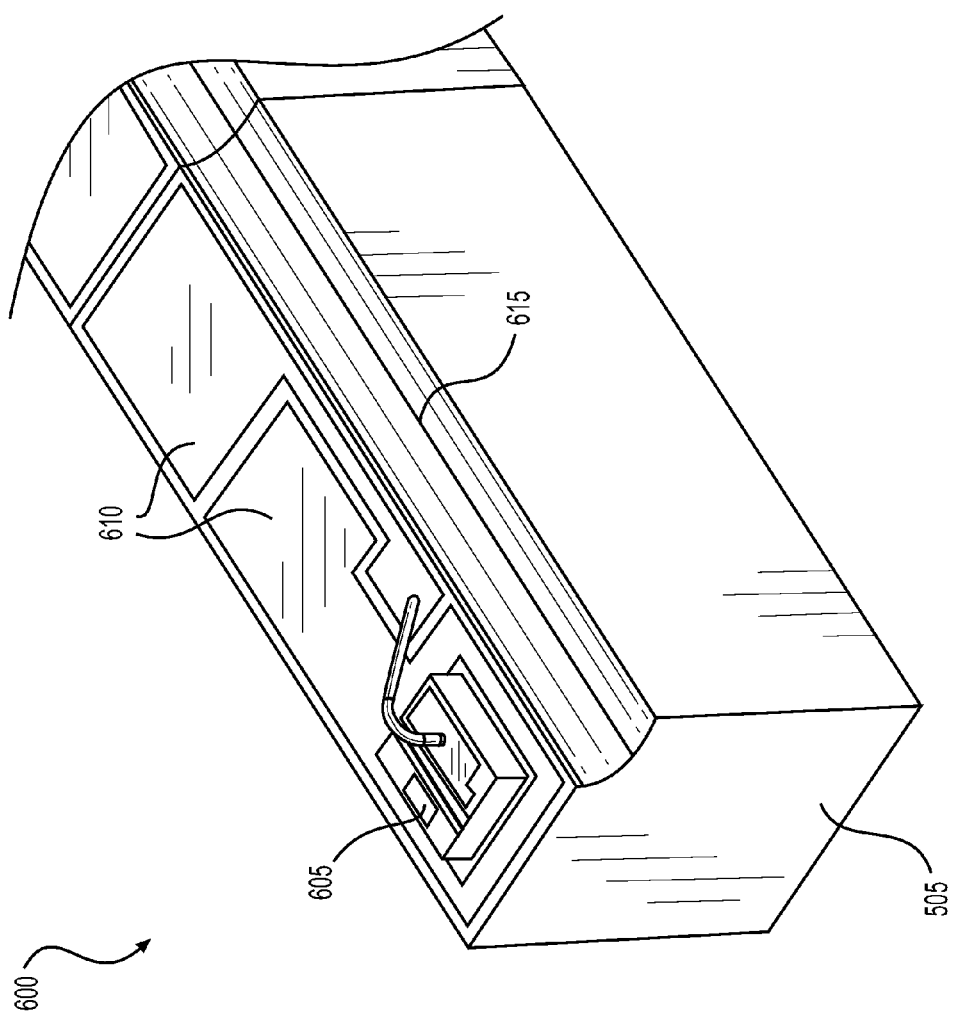

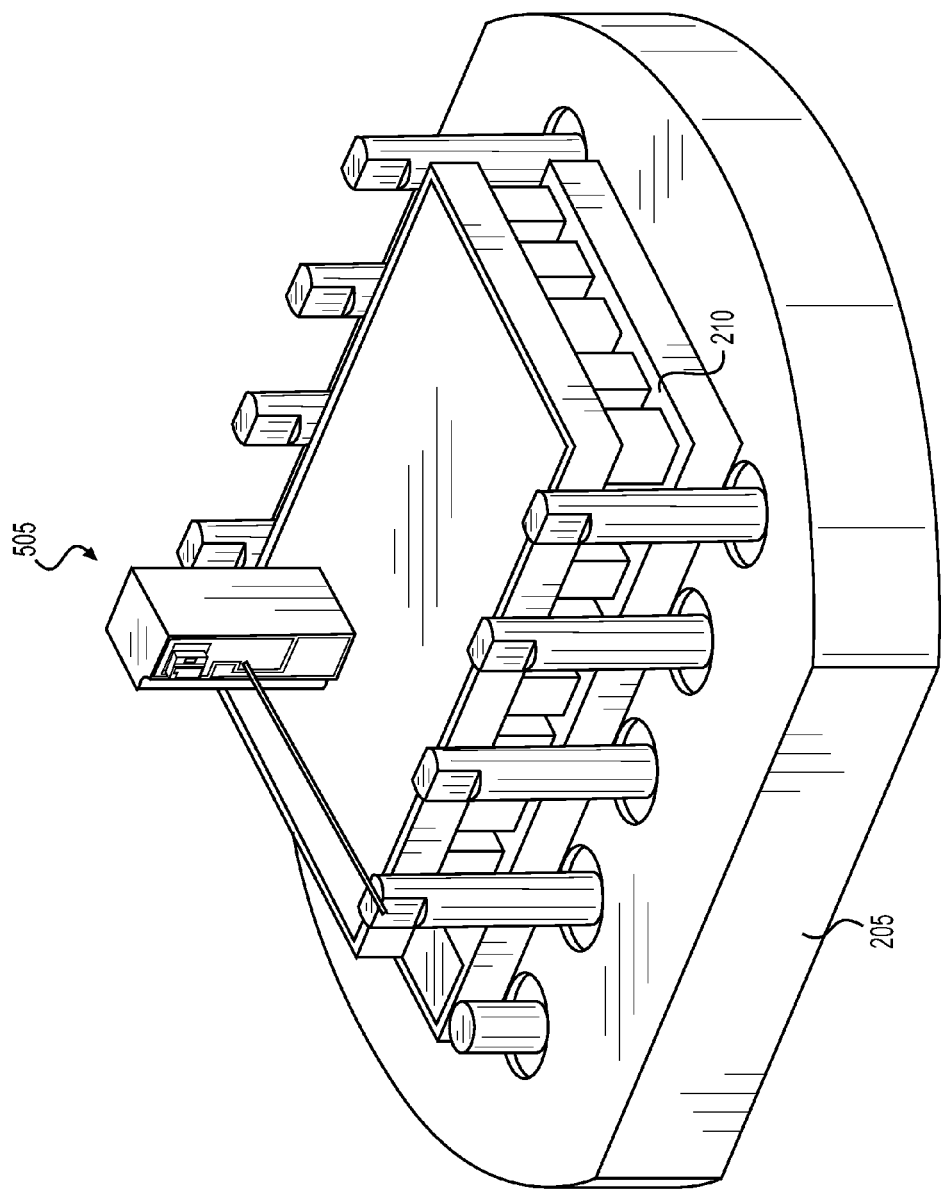

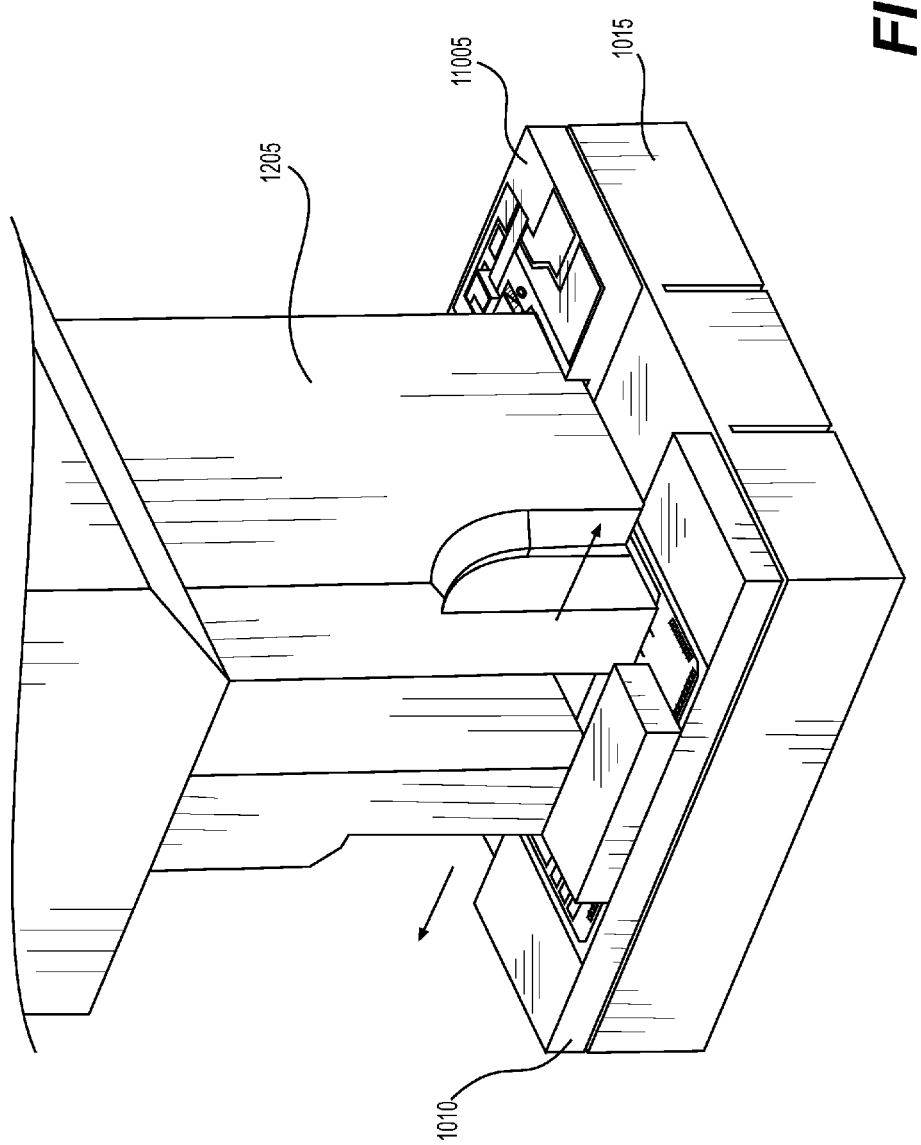

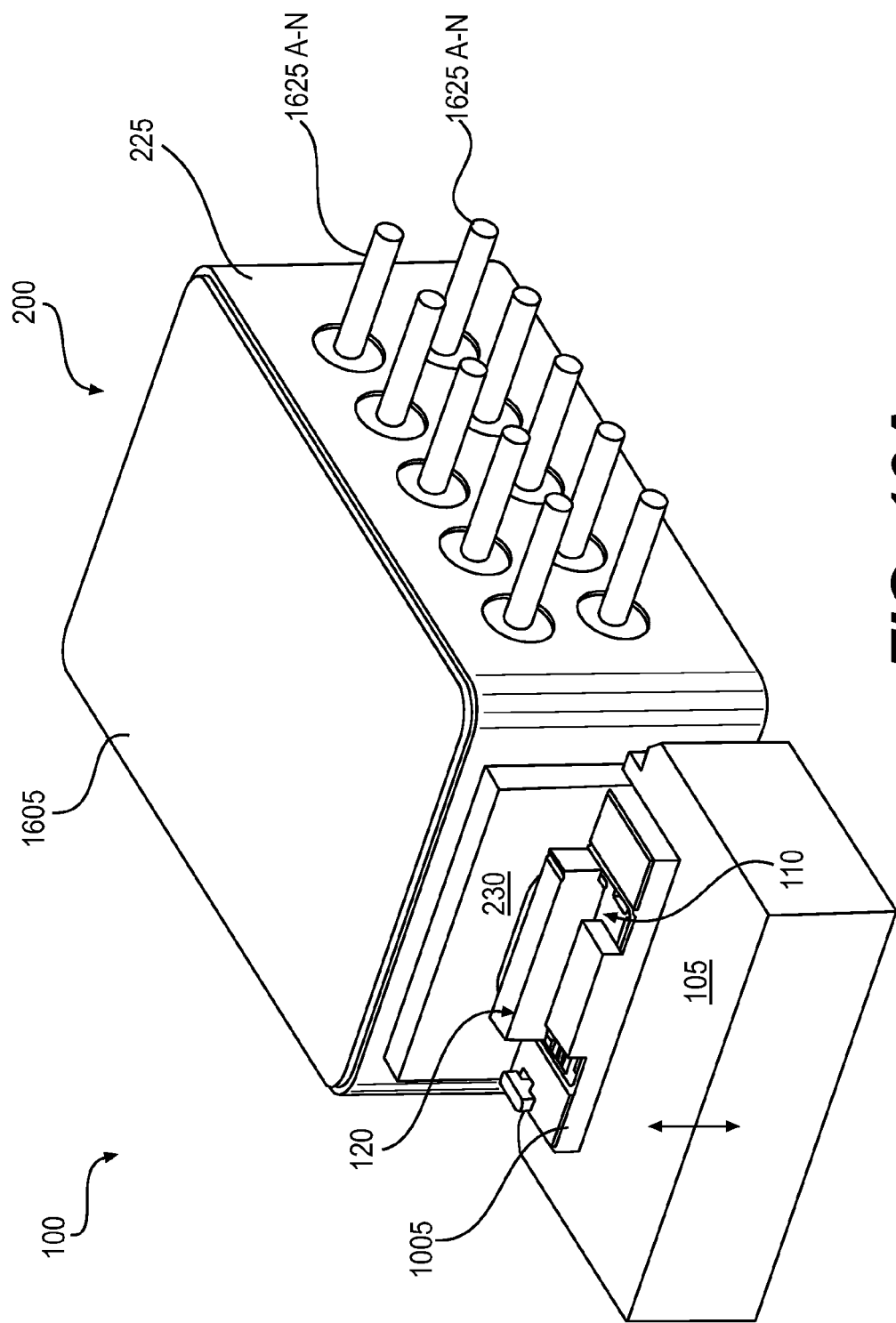

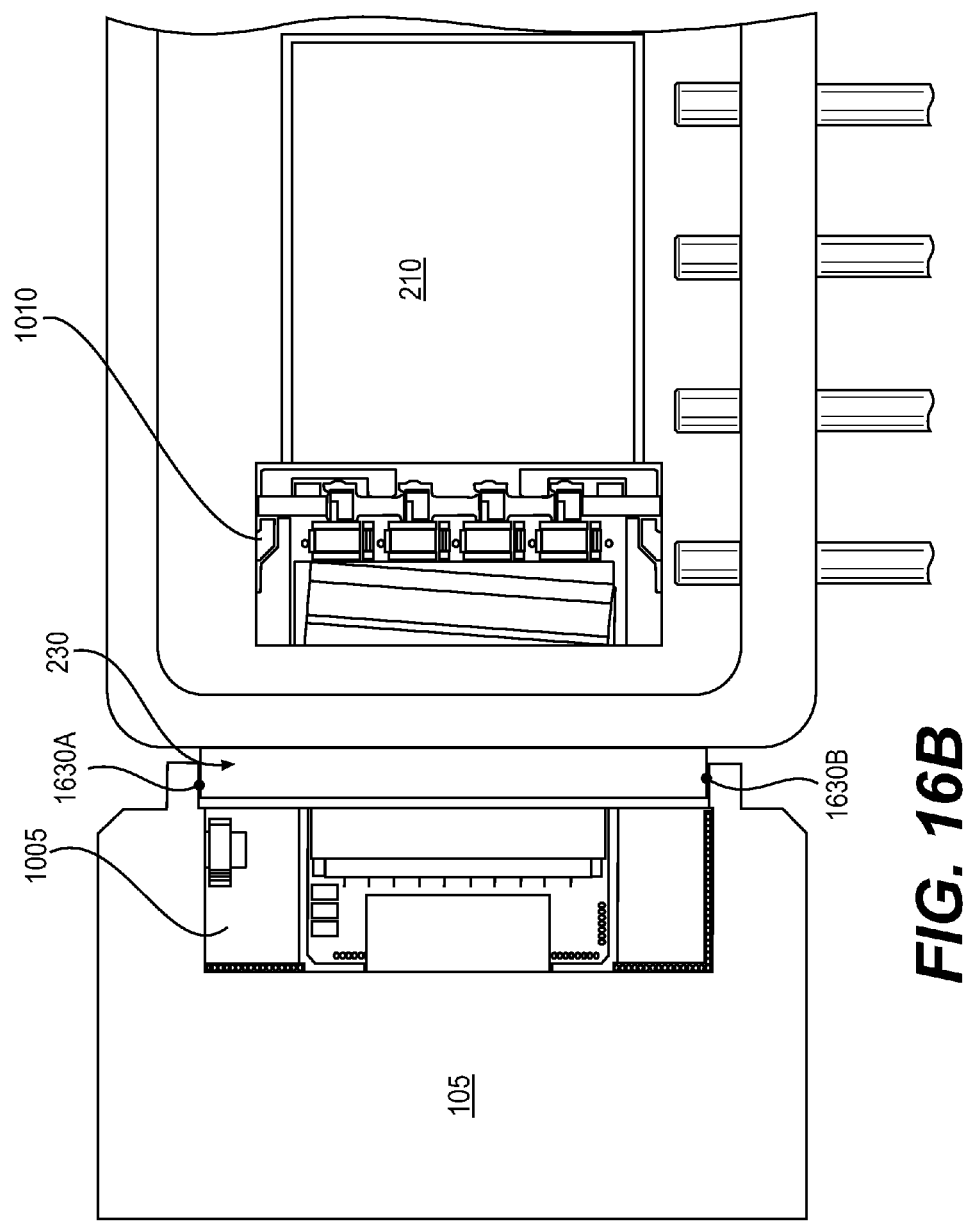

METHOD FOR MANUFACTURING AN OPTICAL COMMUNICATION DEVICE

RELATED APPLICATION

This application is a continuation application of U.S. patent application Ser. No. 14/072,182, filed Nov. 5, 2013, which is hereby incorporated by reference in its entirety.

TECHNICAL FIELD

The present disclosure relates generally to methods and systems for communicating over an optical communication network.

BACKGROUND

Next generation optical solutions utilize silicon photonics in order to achieve power control and continued miniaturization. Using silicon photonic optical modulators within transmitting optical sub-assemblies (TOSAs) for high speed data communication with greater than 40 gigabyte (Gb) transmission rates, one typically needs a continuous light source in the form of semiconductor lasers to be aligned to the modulator section where light is coupled from the laser to the modulator input with the help of individual lenses or lens arrays (to minimize alignment effort). Typically, the lens(es) and modulator are then hermetically sealed inside a suitable enclosure to cool the components without forming condensation. While the creation of such optical devices provides increased throughput and miniaturized structures, the energy requirements for these devices, however, remains high due to the electrical energy required to cool the laser and other components (e.g., modulator) hermetically sealed within the enclosure. Further, manufacturing requirements for perfecting height tolerances in the proper alignment of the lasers within the hermetically sealed enclosure remain strict, and in some cases manufacturing is prohibited or slowed due to these requirements.

Accordingly, a solution is needed for an optical device with increased energy efficiency that also can retain high throughput characteristics. Additionally, a solution is needed for a method of manufacturing an optical communication device that can be performed more easily yet still maintain the strict tolerances required for such devices.

BRIEF DESCRIPTION OF THE DRAWINGS

The components in the drawings are not necessarily to scale relative to each other. Like reference numerals designate corresponding parts throughout the several views.

FIG. 6A illustrates an individually sub-mounted laser according to an implementation of the invention;

FIG. 6B illustrates the placement of a single laser on a sub-mount on a TEC according to an implementation of the invention;

FIG. 12B illustrates the tooling of a wafer configuration with pre-defined breaks according to an implementation of the manufacture of the invention;

FIG. 16A illustrates a perspective view of an optical communication device according to another implementation of the invention;

FIG. 16B illustrates a top view of an optical communication device according to another implementation of the invention;

DESCRIPTION OF EXAMPLE EMBODIMENTS

Overview

Figure 1:
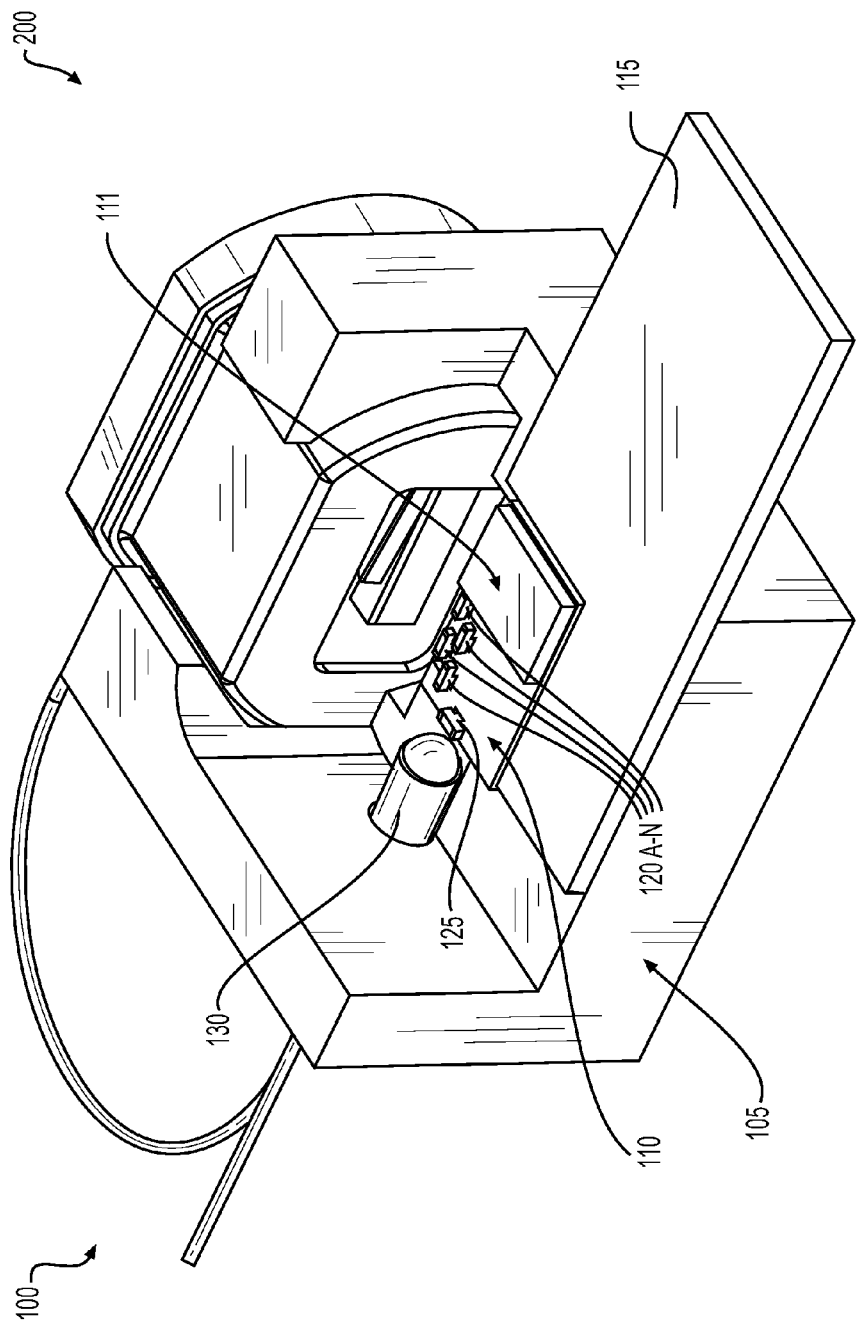
FIG. 1 illustrates a perspective view of an optical communication device according to an implementation of the invention.

Exemplary implementations disclosed herein may provide methods of manufacturing an optical communication device and hermetically sealed sub-assembly. In one example implementation, a method of manufacturing an optical communication device may include positioning a first sub-mount configured to accommodate an optical laser on a carrier wafer approximately adjacent to a first pre-defined break line in the carrier wafer. A second sub-mount is then configured to accommodate an optical modulator on the same carrier wafer approximately adjacent to a second pre-defined break line in the carrier wafer. Optionally, a jaw tool or inverted pyramid tool may then be used to align the first and second sub-mounts such that lasers/lenses on the first sub-mount and the modulator on the second sub-mount are coarsely pre-aligned with subsequent fine alignment step for lenses to maximize optical coupling between laser and modulator.

The first sub-mount can further be hermetically sealed in a sub-assembly. A window in the sub-assembly is aligned with the output of the optical laser. The optical device platform and sub-assembly may then be placed adjacent to each other such that the first and second sub-mounts are optionally passively re-aligned, thus allowing the laser(s) within the first sub-assembly to be aligned with the input(s) of the optical modulator.

In an alternative exemplary implementation disclosed herein, a method of manufacturing an optical communication device may entail preparing a first pre-defined break line in a sub-mount approximate to a portion of the sub-mount that is configured to accommodate an optical laser and preparing a second pre-defined break line in the sub-mount approximate to a portion of the sub-mount that is configured to accommodate an optical modulator. The sub-mount may then be attached perpendicular to a TEC and parallel to an optical device platform (i.e., optical bench). The portion of the sub-mount between the first and second break lines may then be removed so as to allow further manufacture in accordance with methods disclosed herein.

Description

In some optical network devices, lasers are used that require temperature control with a thermo-electrical cooler (TEC) to maintain output wavelength and/or power. To avoid condensation on temperature controlled (cooled) areas, a hermetic enclosure is utilized to enclose the electrical components, modulators, and lasers. For example, in optical device applications, a transmitter optical sub-assembly (TOSA) may be created by hermetically sealing components inside a suitable enclosure. In this way the components (which typically include lasers and optical modulators) may be cooled without forming problematic condensation within the optical device. Accordingly, the TOSA may take electrical input signals through connection leads and export the optical signals through an optical receptacle (e.g., an optical connector or patch chord is inserted into a receptacle to guide light via fiber to its final destination) by way of the hermetically sealed laser and modulator assembly enclosure.

While the creation of such an optical device provides increased throughput and miniaturized structures, the energy requirements for these devices remains high due to the electrical energy required to cool the laser and other components (e.g., modulator) hermetically sealed within the enclosure. This is in part at least because all of the components are located on the TEC and multiple short wire bonds leading to the modulator increase power consumption.

Further, because the modulator is within the hermetically enclosed structure, the electrical leads including multiple RF lines must be routed through non-conducting insulation (e.g., ceramic) from the inside of the enclosure to the connector portion while maintaining the hermeticity of the package, thus creating additional manufacturing expense and hardship. Additionally, the final design of the connector remains high, as hermetic RF feed through is more costly compared to low cost DC feed-through (e.g., glass or metal). Furthermore, manufacturing requirements for perfecting height tolerances in the proper alignment of the lasers within the hermetically sealed enclosure remain strict, and in some cases manufacturing is prohibited or slowed due to these requirements.

In an example implementation, the optical communication device disclosed herein may have a hermetic sub-assembly of lasers and thermo-electrical coolers (TEC) integrated within a sturdy optical platform or bench which further holds optical components—e.g., isolator, optical modulator, mirrors, connectors, and electrical chips/circuits. The cost of the inventive device may be reduced over conventional designs by using TO-industry parts without compromising performance and guaranteeing the highest yield possible. In various implementations disclosed herein, multiple lasers can be placed inside the hermetic package to allow multiple channel transmissions. A window cap on the hermetic enclosure may allow the unsealed components to receive and transmit information from/to the hermetically sealed laser components. In this way, less energy is consumed by the device than conventional optical device configurations.

The present disclosure also provides methods for absorbing the large height tolerances of thermo-electrical coolers (TECs), which can be in the range of plus or minus 0.1 millimeters (mm), without compromising the stability of the optical package. Additionally, exemplary implementations disclosed herein allow for the burn-in of individual lasers to maximize yield and still allow for an arrangement of lasers on a certain pitch to be able to use lens arrays and couple light to a modulator with multiple inputs on the same pitch. The laser may be on a sub-mount, such as ceramic.

In further exemplary implementations disclosed herein, the inventive optical communication device may also have a window forming part of the hermetically sealed assembly for communicating between the laser and an optical input situated outside the hermetically sealed assembly. The optical input and/or inputs may be coupled to an optical modulator (comprising silicon photonics) through which signal processing may be performed on the signal from the laser. An isolator to direct the laser may be either outside or within the hermetically sealed assembly. The optical communication device may also have an optical output for communication with an optical communications network. Various types of optical connectors for receiving an optical signal from the optical output and accessing the optical communications network may also be used.

The TEC that may be used in the optical communication device can be vertically or horizontally oriented within the hermetically sealed assembly. If vertically oriented, height tolerance adjustments of the laser may be made by adjusting the position of the laser vertically on the TEC. If horizontally oriented, height adjustments between the laser and the optical input may be made by varying the bottom lid of the hermetically sealed assembly or the depth of the optical modulator or depth of laser mounting. When the depth of the optical modulator or laser is varied, a spacer below the modulator or within the hermetically sealed enclosure below or above the TEC may be configured to account for height adjustments.

Optionally, the optical communication device may have multiple lasers on a single sub-mount positioned on the TEC (instead of individual lasers on a sub-mount) such that a spacer is positioned underneath the sub-mount and adjacent to the TEC to facilitate heat dissipation generated from the laser or lasers.

Exemplary implementations of the optical communication device described in the present disclosure thus provide for a reliable, flexible, and sturdy optical communication device. One implementation may have a transmitting optical sub-assembly for which low cost components from transistor outline industry (high volume) may be used, such as a standard transistor outline header (TO-header), and window cap with low cost glass/metal hermetic seal. Energy efficiency is provided by hermetically sealing limited areas, such as the cooled or un-cooled laser(s) that may be used as continuous light sources. This allows for the optical modulator and connector sections of the inventive optical communication device to remain outside the hermetic package, providing advantages as described herein. This also prevents costly hermetic radio frequency (RF) feed through.

According to the various implementations, the disclosure provided herein is capable of providing advantages over the conventional TOSA connector. First, the hermetic area disclosed herein may contain direct current (DC) lines and no radio frequency (RF) signals thus allowing cheaper and easier routing than conventional designs. (This is in part because glass/metal feed-through with round pins is only effective for less than 10-Gb speeds. Beyond 10-Gb speeds, ceramic multi-layer has superior RF performance (less reflection/radiation and more transmission of RF signals).) Specifically, preparing a feed-through of DC signals into the hermetic area is much cheaper and easier compared to routing RF signals because simple glass/metal seals can be used versus multiple ceramic layers mating with metal seals as required for RF routing. Second, the optical communication device may comprise, in certain implementations, lower cost standard packaging parts, such as ceramic sub-mounts, standard window caps, and/or standard pin headers. Third, the optical communication device may have a higher laser burn in yield due to the preferred individual laser on a sub-mount design described herein where individual sub-mounts may be replaced instead of replacing a multiple laser sub-mount due to a single laser failure. Fourth, the optical communication device may produce lower power consumption because it only requires that lasers within the hermetic package be cooled as opposed to electronics contained within the modulator section as required by conventional devices. Fifth, the optical communication device may produce a lower passive head load since no short wire bonds from hot to cold are required. Sixth, the optical communication device provides an elegant solution for the separation of lasers and modulator by tilting the TEC 90-degrees (or substantially vertical) to deal with TEC height tolerances without compromising stability or requiring more complicated design features to absorb TEC height tolerances (like shimming, laser or modulator height adjustment).

In one implementation disclosed herein, low-cost TO-header technology with multiple I/O pins can be used to allow DC routing of laser biases, along with TEC current and temperature sensor connections (e.g., connections for thermistor). The laser(s) can be mounted on individual sub-mounts (preferably low cost and high thermal conductivity ceramics versus more costly silicon processed sub-mounts with lower thermal conductivity, which increases TEC power). This would allow individual burn in of each laser on sub-mounts and passing dies could be used for subsequent assembly. That way burn in yield is maximized versus simultaneous burn in of several lasers on the same sub-mount which would make the whole sub-assembly fail if only one laser burn-in failed. However, it is to be understood by those of ordinary skill in the art, that the sub-assembly could use any kind of sub-mounts covering both individual or group (wafer) burn in strategies.

If the preferred individual laser sub-mounts are implemented, the shape of the sub-mounts may allow for each individual laser to be mounted on the TEC top surface to allow light emission in line with the TO-package center axis. This would also allow multiple sub-mounts with lasers to be arranged on a pitch of as little as 0.5 mm to match the pitch of the lens arrays and/or the modulator section pitch. To allow easy handling and burn in of individual sub-mounts, it is preferred that they have a minimum size of 0.8 mm to 0.9 mm. Also, burn in requires minimum pad size on laser sub-mounts to make a reliable electrical contact (e.g., with pogo pins). Optionally, the arrangement of several sub-mounts on the TEC top surface can be alternating (or opposing) so that all odd channels are facing one way and even channels are rotated the opposite way (i.e., 180 degrees). This allows the sub-assembly to maintain the desired smaller pitch (e.g., 0.5 mm). Otherwise, a pitch such as 1.0 mm would be the minimum pitch size, accordingly limiting the packaging size. In accordance with the individual sub-mount implementation, a cut out on one sub-mount side may be utilized to avoid interference with the laser wire-bond of the adjacent channel. The clearance cut on the sub-mount can easily be added before sub-mount separation by a dicing blade without adding much cost. In contrast, conventional designs use more costly reactive ion etching on silicon to create clearance cuts.

Electrical connection may be established by wire bonds from sub-mount pads to the TO-header pins (as discussed with reference to FIG. 6). Layout of both sub-mount and header pins can also be carefully chosen to maintain a small footprint and still allow wire bondability. On the sub-mount backside where it makes contact with the TEC top surface, conductive epoxy can be used to electrically connect the sub-mount pad to a metalized or patterned TEC top surface and/or additional patterned substrate mounted to the TEC top surface (i.e., could be a common ground for all lasers). The electrical connection can be a 90-degree bend via the conductive epoxy on the sub-mount pad close to back side to TEC top surface. This would be the lowest cost solution (without a 90-degree epoxy path, wire bonds would need to replace the connection because there is limited space/access for additional pads; wrapping metal pads around edges opens up additional space to place pads but increases the cost for the sub-mount). Alternatively, as noted, sub-mounts with conductive paths wrapping around (multiple) edges could be used to have a wire-bond connection only. However, this would increase the cost of the sub-mounts.

Optionally, to increase the mechanical integrity of the laser sub-mount array on a vertically mounted thermo-electrical top surface a frame structure can be glued to the front side of the sub-mounts connecting all sub-mounts with each other and increasing the stiffness of the assembly.

Each laser can be mounted at a controlled distance to the front face of the sub-mount. A first lens can then be aligned and glued to each of the front faces of the sub-mounts to collimate or bend the laser light. This allows larger physical separation between the laser and the modulator section to accommodate the hermetic sealing with a window cap. Alternatively a lens array can be aligned and glued to the laser sub-mount front surfaces.

Accordingly, the hermetic sub-assembly comprised of a TO-header and window (lens cap) containing multiple lasers, TEC and temperature sensor (e.g., thermistor) builds a robust unit that can be easily handled and tested before being used in subsequent assembly steps. The optical sub-assembly can then be aligned and fixed (by weld, glue and/or solder) within the optical bench so that the laser signal/light may be horizontal to the optical bench. This requires a 90 degree tilt of the header with regards to the optical platform/bench. In this way, the optical setup is immune against any TEC height tolerances. It also allows exact alignment of laser beams in x/y/z and angle to match the optical height and position of the modulator such that the modulator height does not have to be strictly controlled. It should be noted that the use of a TEC is not mandatory for some implementations (e.g., CWDM or non-WDM). For those applications, the TO-header would only provide hermetic package for the un-cooled laser(s), still allowing the usage of laser(s) that requires hermetic packaging (which is required, for example, by a majority of current commercially available Indium phosphide lasers).

Consistent with this disclosure, the optical bench material may be a variety of materials, including but not limited to, kovar or CuW to match the silicon coefficient of thermal expansion (CTE) and to also provide good heat sinking in case of CuW. Metal injection molding (MIM) can alternatively be used for the optical bench in order to reduce cost for higher volumes of the optical communication device. Typical metal injection molding dimensional tolerances are acceptable for the present invention.

Alternatively, ceramic could also be used as optical bench material but it is more challenging to machine to the required shape. Additionally, a hybrid of ceramic/metal or metal/metal is an option if laser welding is required, especially for a connection between the TO-header and the optical bench and the fiber optic connector/receptacle to the optical bench.

According to one implementation of the manufacture of the inventive optical communication device, isolators between the lasers and modulator would be attached to the device, followed by the placement and adhesive attachment of the modulator to the optical bench. Coarse alignment is also acceptable in the event a secondary lens (or array) is used on the modulator input side (such a secondary lens alignment would require high precision). Alternatively, a staggered layout of modulator input channels would allow larger secondary lenses and easier tooling access. Further, in another alternative implementation, all modulator inputs can be on the same line and a secondary lens array could be used.

To route the modulator output light more easily to a fiber (array) connector, it is beneficial to have the modulator output side be different than the input side to allow for an easier arrangement of components not available due to space constrains when arranging on the same side. In any event, the fiber (array) connector placement and attachment to the optical platform/bench can be either the last or second-to-last optical alignment step depending on process preferences for manufacturing the optical communication device. As noted, individual or array lenses can be used.

As further disclosed herein, the optical bench can be designed such that one or more driver integrated circuits can be mounted adjacent to the modulator or even placed directly on the modulator. Connection to a printed circuit board (PCB) can be such that wire bonds or flex connections used between an integrated circuit and PCB or alternatively a cut out on the optical bench could allow a ball grid array (BGA) attachment of the integrated circuits to the PCB.

A further aspect of an exemplary implementation of the optical communication device disclosed herein includes the heat sinking of the TEC. In a vertical orientation, the heat has to take a 90 degree turn from header backside to the heat sink which is typically parallel to the optical bench. By using high thermal conductivity steel for the header and an appropriate heat sink, which makes contact to the header back side (e.g., copper finger), the temperature drop within the heat sink path can be minimized to an acceptable level (e.g., adding an additional high thermal conductive material to the header backside offers the heat a parallel path decreasing thermal resistance and temperature drop to ambient temperature).

The figures disclosed herein provide further details for the inventive optical communication device.

FIG. 1 illustrates a perspective view of an optical communication device 100 according to an implementation of the invention. The optical communication device 100 may comprise two main components: the optical platform/bench 105 and the hermetically sealed optical sub-assembly 200. As shown, a modulator 110 (comprising silicon photonics) and a printed circuit board (PCB) 115 may be fixably attached to the optical communication device platform 105. Additionally, an electrical integrated circuit 111 (e.g., a flip chip bonded via a BGA) may be bonded to the modulator 110.

One or more input lenses 120A-N may reside on the modulator 110 to couple laser signals received from the optical sub-assembly 200 into the photonic modulator 110 for processing. A laser output lens 125 on the modulator 110 may also be used to couple the output of the photonic modulator 110 to an optical communication network through an optical interface 130 (such as the lensed fiber receptacle 130 shown in FIG. 1 or alternative receptacles (not shown)). It should be noted that additional components may be placed on the optical bench/platform 105, including but not limited to passive electrical components and active driver integrated circuits, main electrical PCB 115, and/or micro optics turning mirrors. The electrical connection to the PCB 115 (or other main electrical board) can be done by a ball grid array (BGA) or can also be done by flexible PCB or wire bond.

The optical interface 130 may comprise a variety of forms, including but not limited to, a lensed fiber (shown in FIG. 1) or any other optical receptacle to allow a connection to an optical patch cord. Regardless of the type, the optical interface 130 can be attached to the optical platform (e.g., glued, soldered or welded) before or after the output lens is aligned and put into place at the modulator output side to couple maximum light into the optical interface 130.

Figure 2:
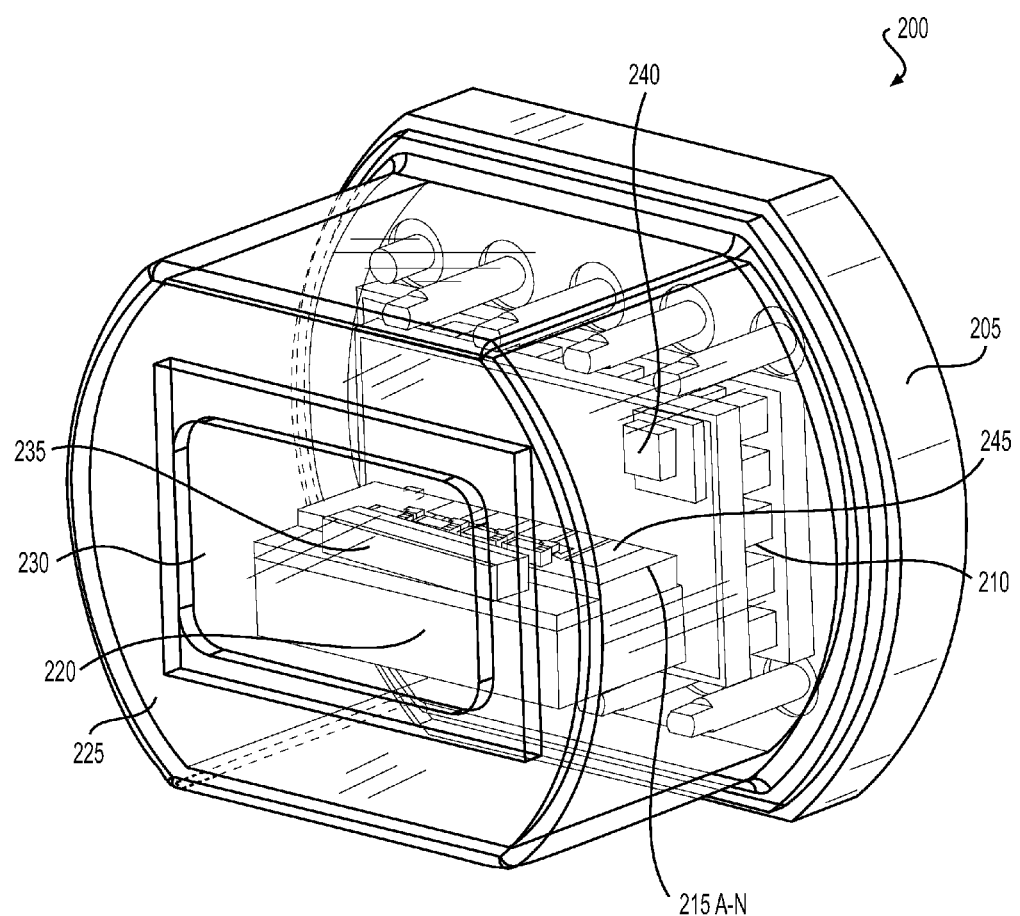
FIG. 2 illustrates a hermetically sealed laser sub-assembly showing a single sub-mount with multiple lasers on it according to an implementation of the invention.

FIG. 2 further illustrates the hermetically sealed optical sub-assembly 200 according to one implementation of the invention. The sub-assembly 200 provides an air-tight sealed enclosure for placement of a TEC 210 and sub-mounted lasers 215A-N. As shown, to maximize heat dissipation and increase mechanical stability, a spacer 220 may be incorporated underneath the lasers 215A-N. This spacer 220 may comprise a material, such as ceramic, or other material intended to dissipate heat from the sub-mounted lasers 215A-N. The lasers 215A-N may be individually sub-mounted (as discussed with regard to FIGS. 6A-E) or alternatively mounted together on a sub-mount. To direct the optical light or signal from the lasers 215A-N to the modulator 110, one or more lenses (or a lens array) may be mounted adjacent to the lasers 215A-N. Metalized pads 245 may be used to carry current to the sub-mounted lasers 215A-N. As shown in FIG. 4, there may be a gap 310 between the TEC 210 and the laser sub-mount (which is typically silicon) so that the electrical pads 245 do not short on the TEC 210. If this gap is filled with electrical conductive adhesive (like silver filled epoxy), there is a risk of electrical shortage due to overflowing epoxy. Therefore, an epoxy that has high thermal conductivity but is not electrically conductive is preferred. For example, in one exemplary implementation, an epoxy filled with ceramic particles can be used to provide a thermal, but not electrical, conductive epoxy (as discussed further with regard to FIG. 3).

The temperature inside the hermetically sealed sub-assembly 200 may be measured by a temperature sensor like thermistor 240. As further shown in FIG. 2, the optical sub-assembly may also comprise a window cap 230 that allows laser light to reach the modulator 110 optical signal inputs 120A-N (as shown in FIG. 1). In this implementation, an isolator 235 is located next to the sub-mounted lasers 215A-N. However, as described herein, this isolator 235 alternatively may be located outside the sub-assembly.

Figure 3:
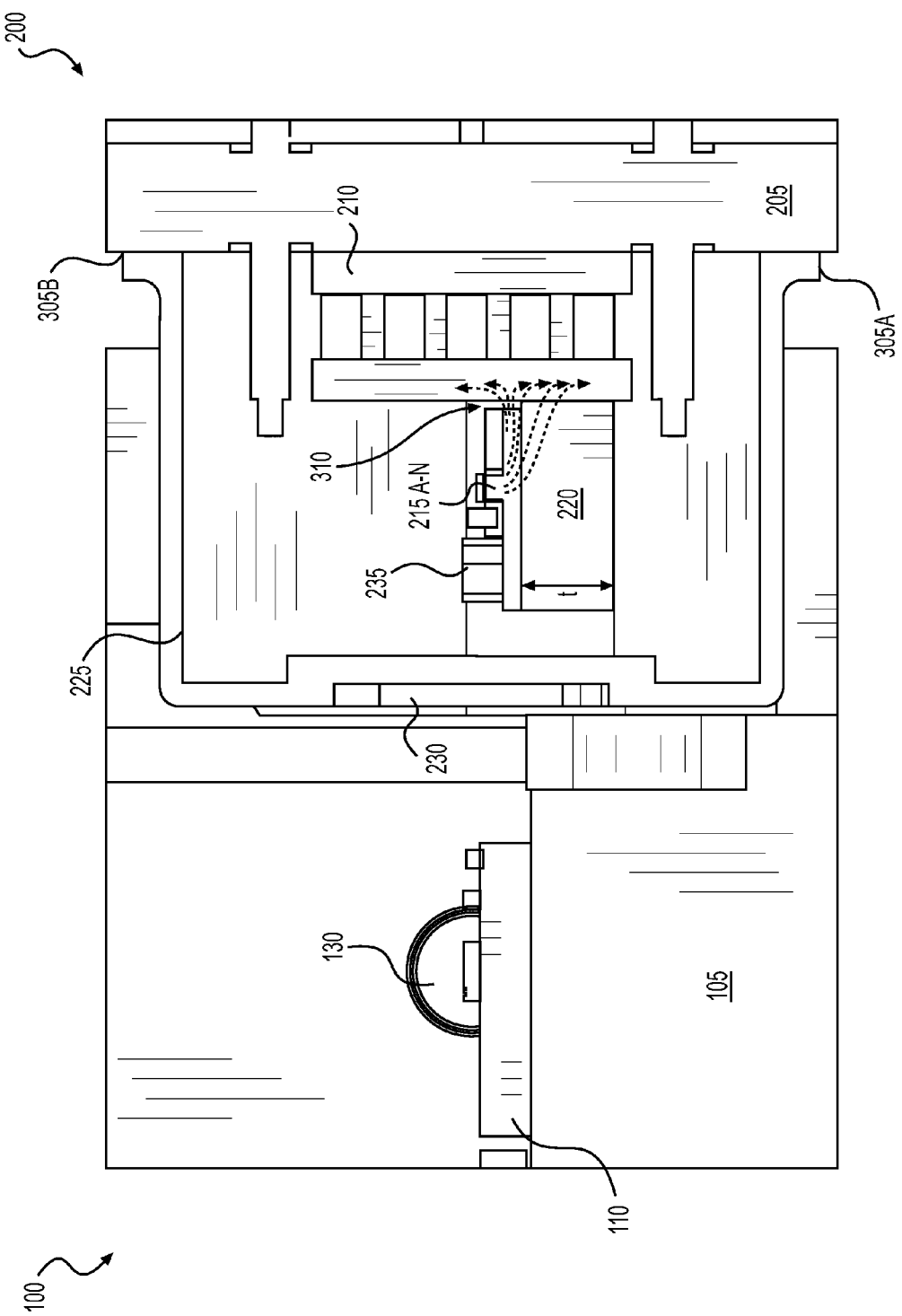
FIG. 3 illustrates a cross-section view of an optical communication device according to an implementation of the invention.
Figure 4:
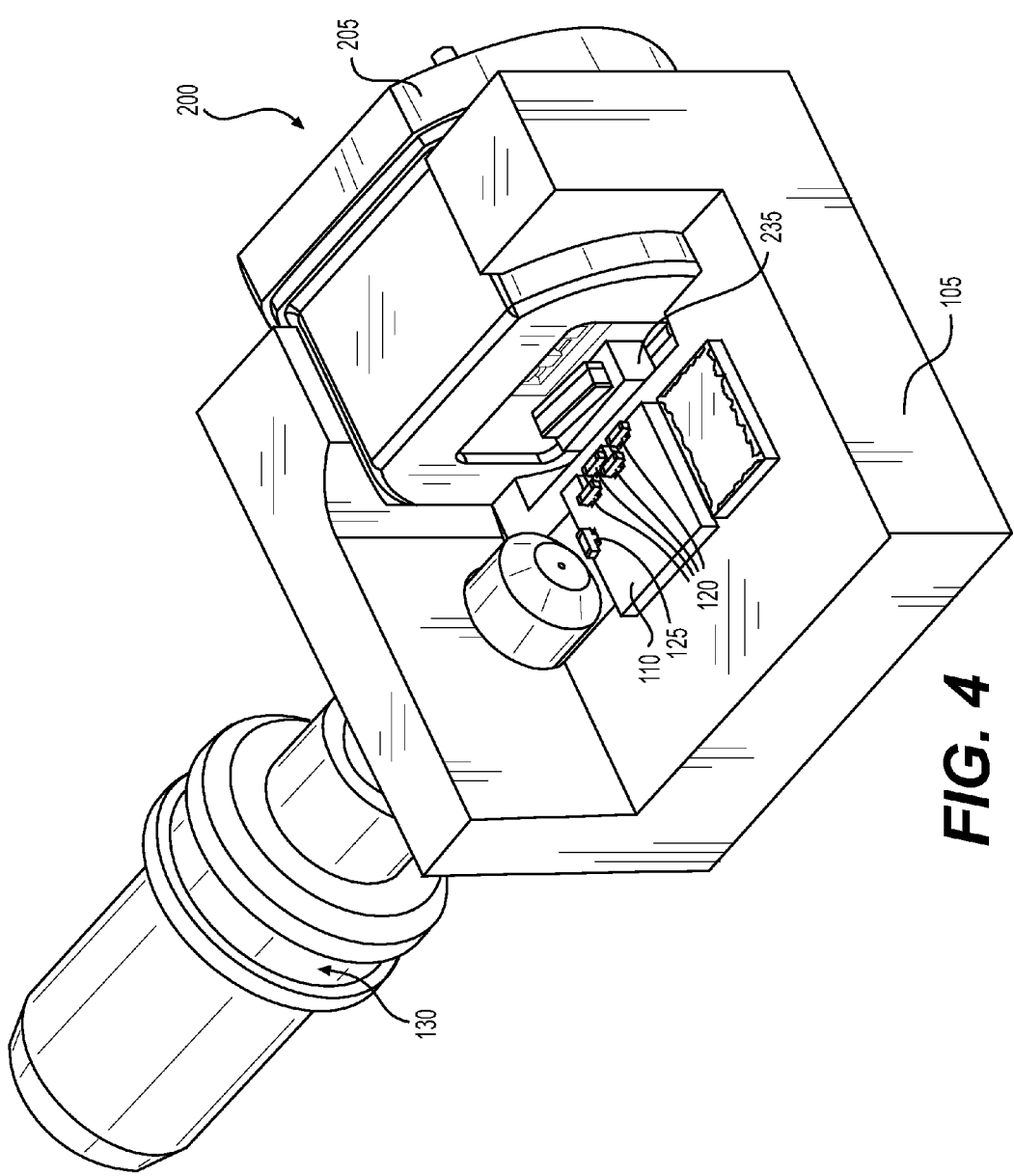
FIG. 4 illustrates a perspective view of an optical communication device according to an implementation of the invention.

FIG. 3 illustrates a cross section view of an optical communication device 100 according to an implementation of the invention. As shown in this implementation, the TEC 210 and header 205 are turned 90-degrees to a substantially vertical position. Doing so allows for the height tolerances to be easily accounted for between the location of the modulator 110 and the output of the lasers 215A-N. For example, the spacer 220, sub-mounted lasers 215A-N, and isolator 235 could be adjusted vertically to account for any variances arising between the placement of the modulator 110 and the lasers 215A-N. Alternatively, the sub-assembly 200 itself could be adjusted when placed in the optical platform 105 to create proper alignment between the lasers 215A-N and modulator 110, if required, before being fixably attached to the optical platform.

As also shown in FIG. 3, a gap 310 may be provided between the sub-mount of the laser (e.g., silicon) and the TEC 210 to prevent an electrical shortage at the laser. In this configuration, heat travels from the laser (i.e., the source of the heat), down through the sub-mount, and through the spacer 220 to the TEC 210. Alternatively, as mentioned previously, the gap 310 may be filled with a high thermal conductivity epoxy (e.g., 3 W/mK), such as epoxy filled with ceramic particles, to improve thermal performance, thus allowing the heat to travel directly through the epoxy to the TEC 210. An example illustrates the thermal efficiency gained through this approach. For example, with spacer thickness of t=0.5 mm, the laser temperature may be reduced by approximately 1.2° C. and for t=2 mm, the reduction can be approximately 0.5° C. (assuming the temperature of the laser is 50° C. and the ambient temperature is 75° C.). This is significant, as with four lasers running at 120 mA each, this amounts to a TEC power savings of 40 mW per 1° C.

FIG. 4 illustrates a perspective view of an optical communication device according to another implementation of the invention. As noted, the isolator 235 in this implementation is shown outside of the hermetically assembled sub-assembly 200. Further, this implementation illustrates that the optical communication device 100 may connect to an optical network through any number of interface 130 configurations (e.g., receptacles).

Figure 5:
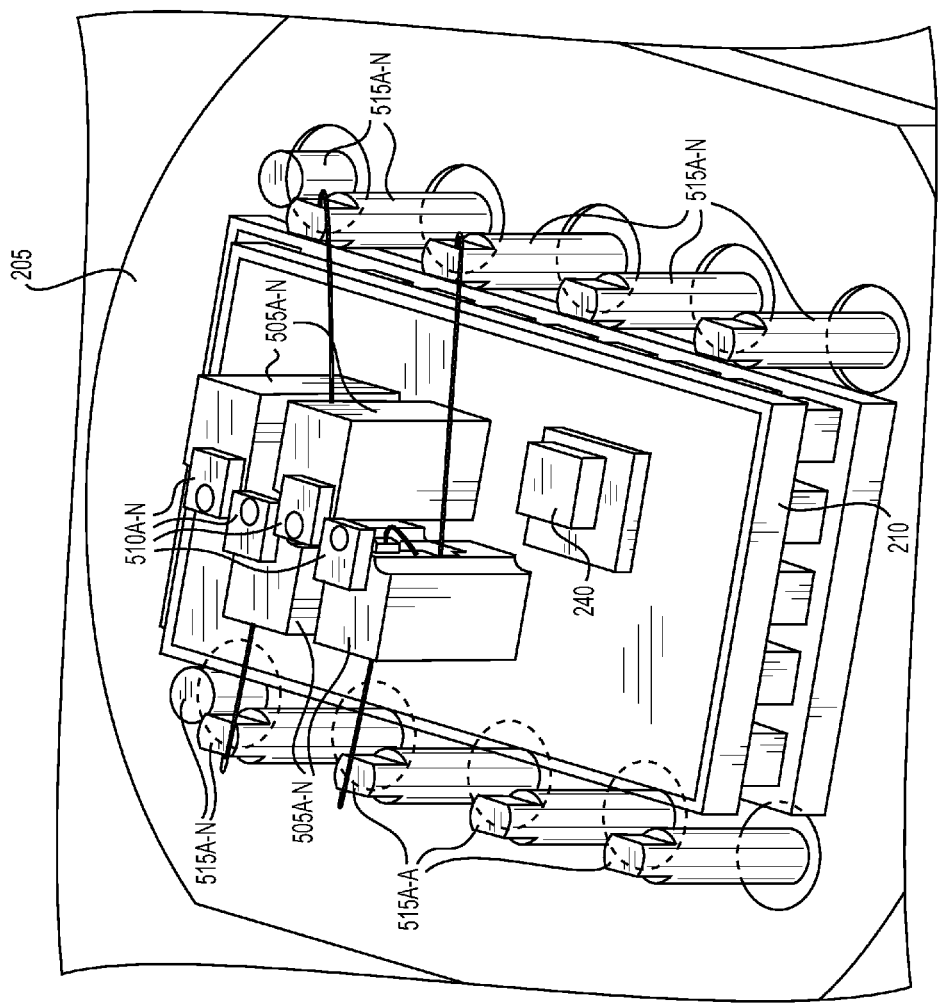
FIG. 5 illustrates placement of individual sub-mounted lasers on a TEC according to an implementation of the invention.

In the implementation shown in FIG. 5, individual sub-mounted lasers 505A-N may be placed on a TEC in an opposing configuration to accommodate a smaller pitch as previously discussed. This configuration may be used as an alternative to the multiple lasers on a sub-mount configuration. In either case, to facilitate the exchange of laser light or signals between the sub-assembly 200 and the modulator inputs 120A-N, the sub-mounted lasers beneficially have lenses 510A-N to focus or collimate the laser light so that it may extend through the window cap 230 and reach the modulator inputs 120A-N. Alternatively, a lens array may be used in place of individual lenses.

Figure 6C:
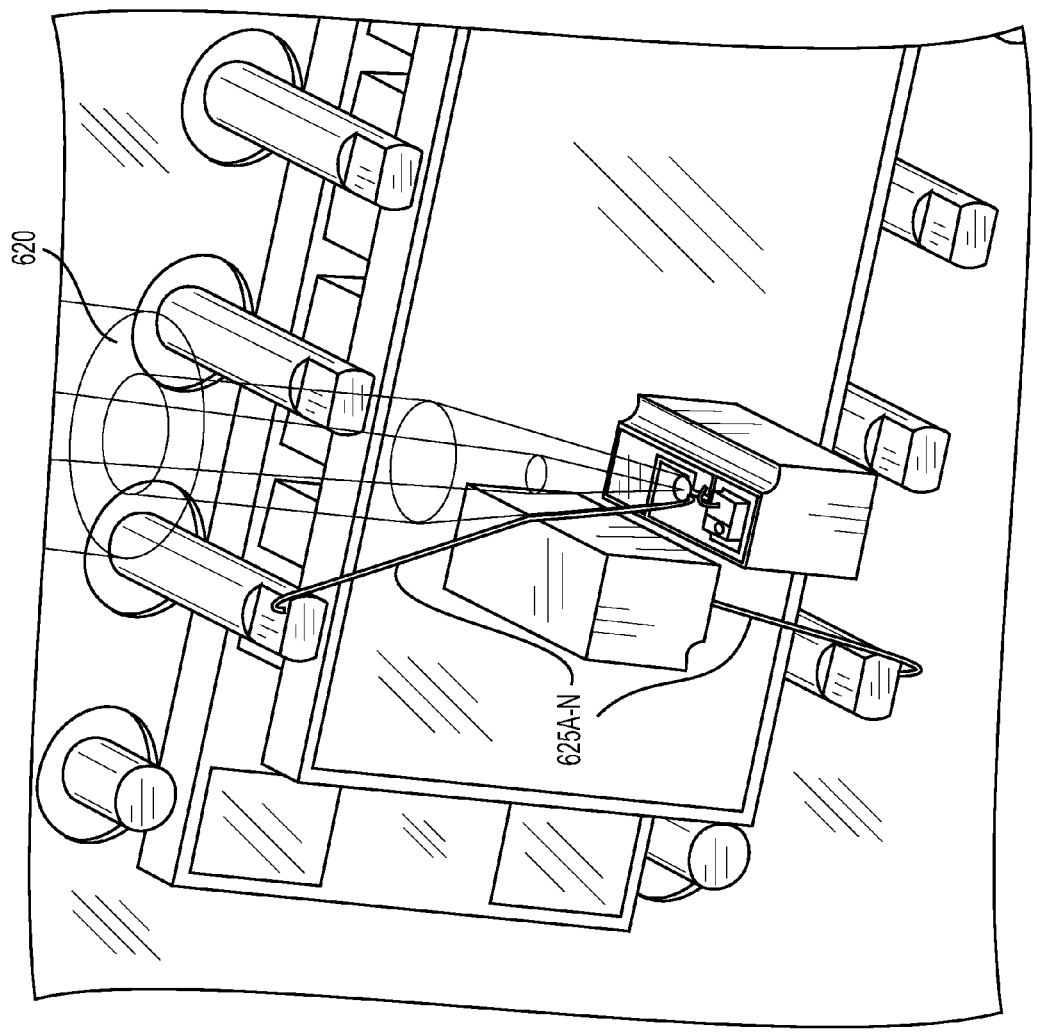
FIG. 6C illustrates the placement of two lasers on individual sub-mounts on a TEC and illustrating routing of wire bonds including clearance check for wire bond capillary according to an implementation of the invention.

FIGS. 6A through 6E illustrate a preferred design and configuration for the placement of individual sub-mounted lasers 505A-N according to an implementation of the invention. In FIG. 6A, a single sub-mounted laser is shown. The laser on individual sub-mount design comprises a laser 605 with a wire bond, burn in pads 610 (for electrical contact during burn in needle or pin contact), and a clearance 615 cut to avoid contact with the wire bond of adjacent lasers. As noted previously, the clearance 615 may be formed by a dicing blade without adding much cost to the manufacturing process.

FIG. 6B further illustrates the placement of the single sub-mounted laser 505 on the TEC 210 according to an implementation of the invention. The laser on a sub-mount 505 may be glued or otherwise fixably attached to the TEC 210 and a wire bond may be extended to form an electrical connection to a pin on the header 205 or other pin assembly used in the hermetically sealed sub-assembly 200. In accordance with FIG. 6C, a second sub-mounted laser 505 may be placed on the TEC 210 adjacent to and opposing the first individually sub-mounted laser 505. This configuration allows for efficient routing of wire bonds 625A-N to pins on the header 205. Further, as shown, this placement allows adequate clearance for using a tool 620 to attach the wire bonds 625A-N.

Figure 6D:
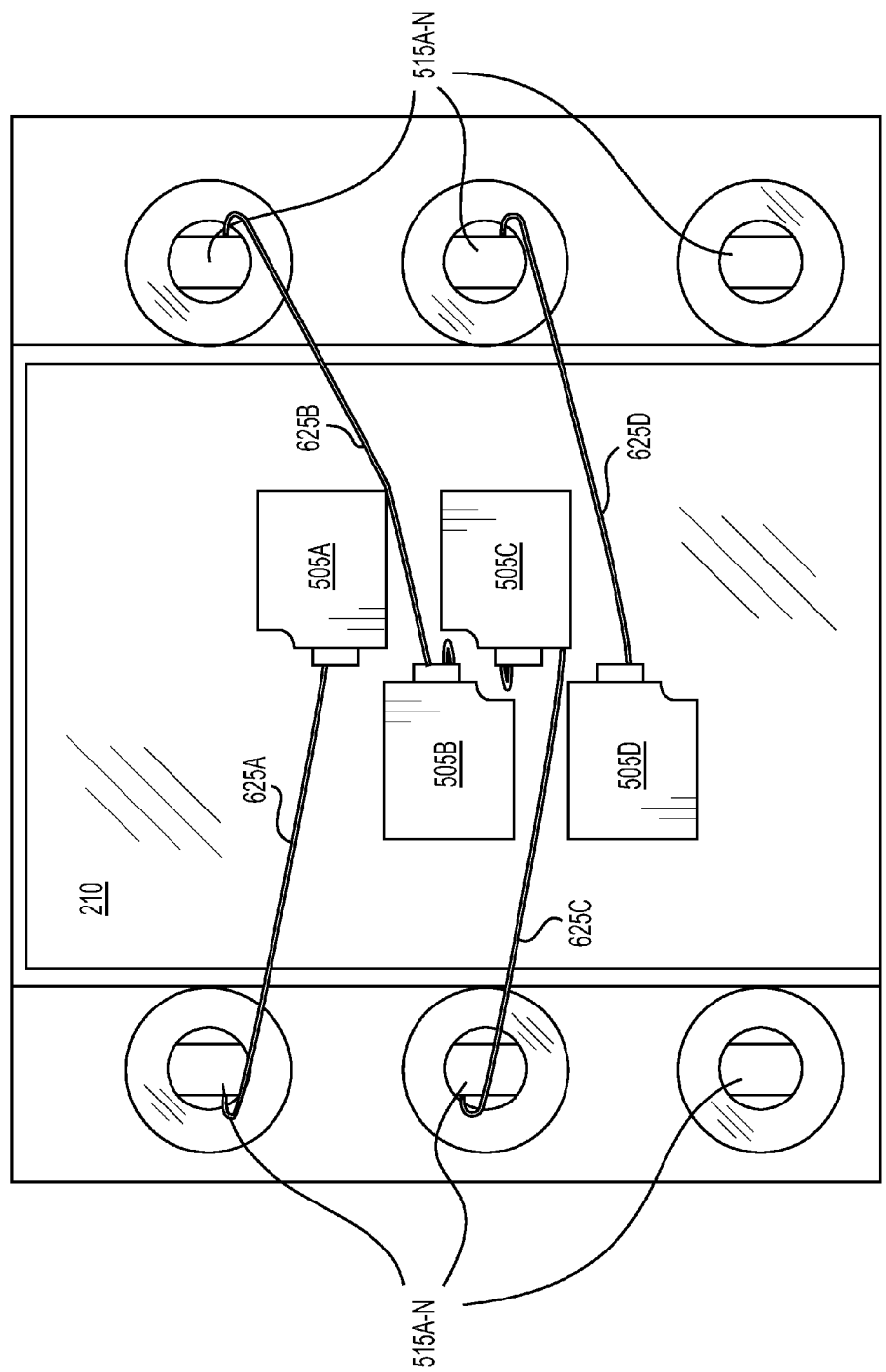
FIG. 6D illustrates the placement of four lasers on individual sub-mounts on a TEC according to an implementation of the invention.
Figure 6E:
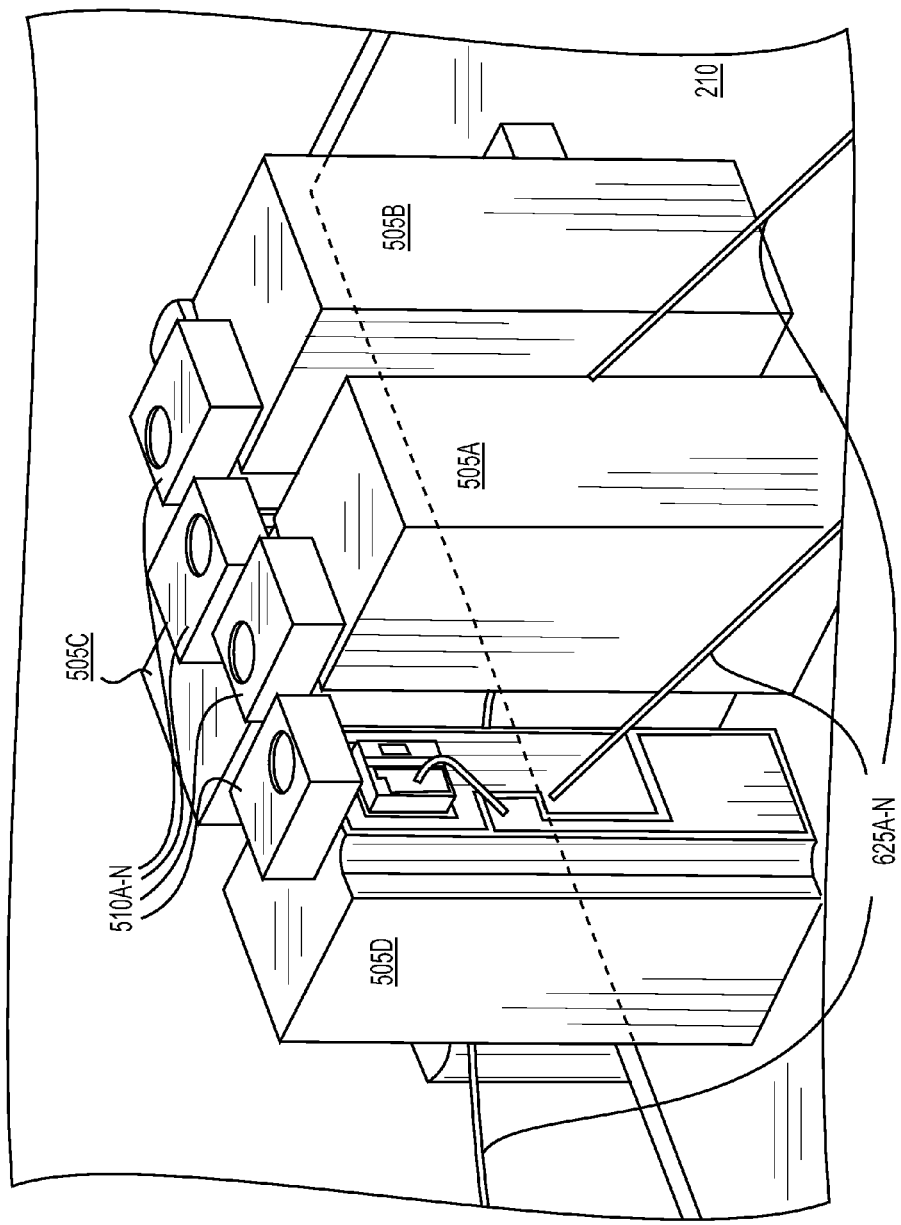
FIG. 6E illustrates the placement of four lenses and wire leads on four individually sub-mounted lasers on a TEC according to an implementation of the invention.

As shown in FIG. 6D, four sub-mounted lasers 505A-D have been placed on the TEC 210 according to an implementation of the invention. Each may be connected to respective pins 515A-N through wire bonds 625A-D. FIG. 6E illustrates the placement of four lenses on the four lasers 505A-N on individual sub-mounts on a TEC 210 according to a further implementation of the invention. As previously noted, a lens array could alternatively be used in place of the individual lenses.

The positioning of the lasers 505A-N in a line in an opposing manner as shown in FIGS. 6B through 6E allows for a smaller controlled pitch. Preferably, this pitch can range from 0.5 mm to 1.0 mm, and a pitch of 0.5 mm is shown in FIGS. 6D through 6E. This pitch provides advantages because it allows for denser component arrangement, smaller footprint and lower cost.

Figure 7:
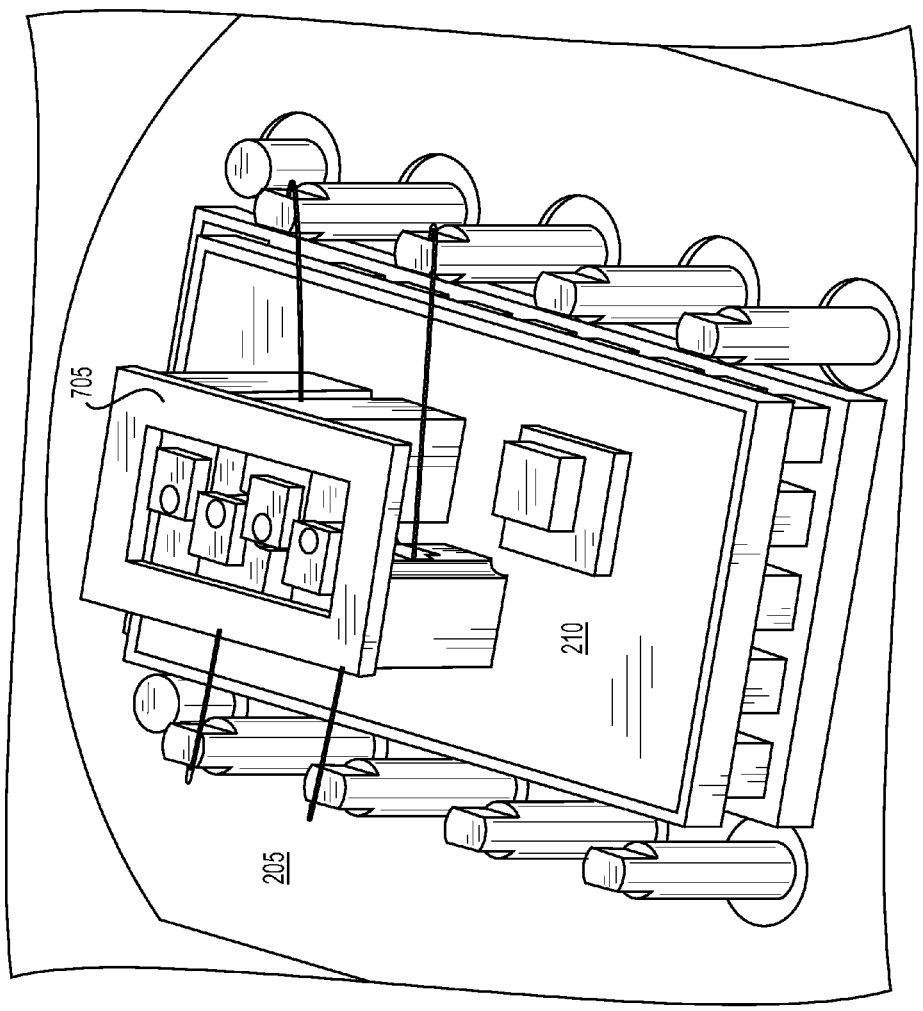
FIG. 7 illustrates a perspective view of the alignment of four lenses on four lasers on individual sub-mounts on a TEC providing mechanical stabilization and improved reliability according to an implementation of the invention.

In FIG. 7, an exemplary implementation of the sub-mounted laser 505A-N configuration is shown with a metal (or other material) frame 705 that has been optionally glued or otherwise fixably attached to the sub-mounted lasers 505A-N around the lenses 510A-N to stabilize the structure. Such stabilization allows for more stable performance over all operations, conditions and in better reliability.

Figure 8A:
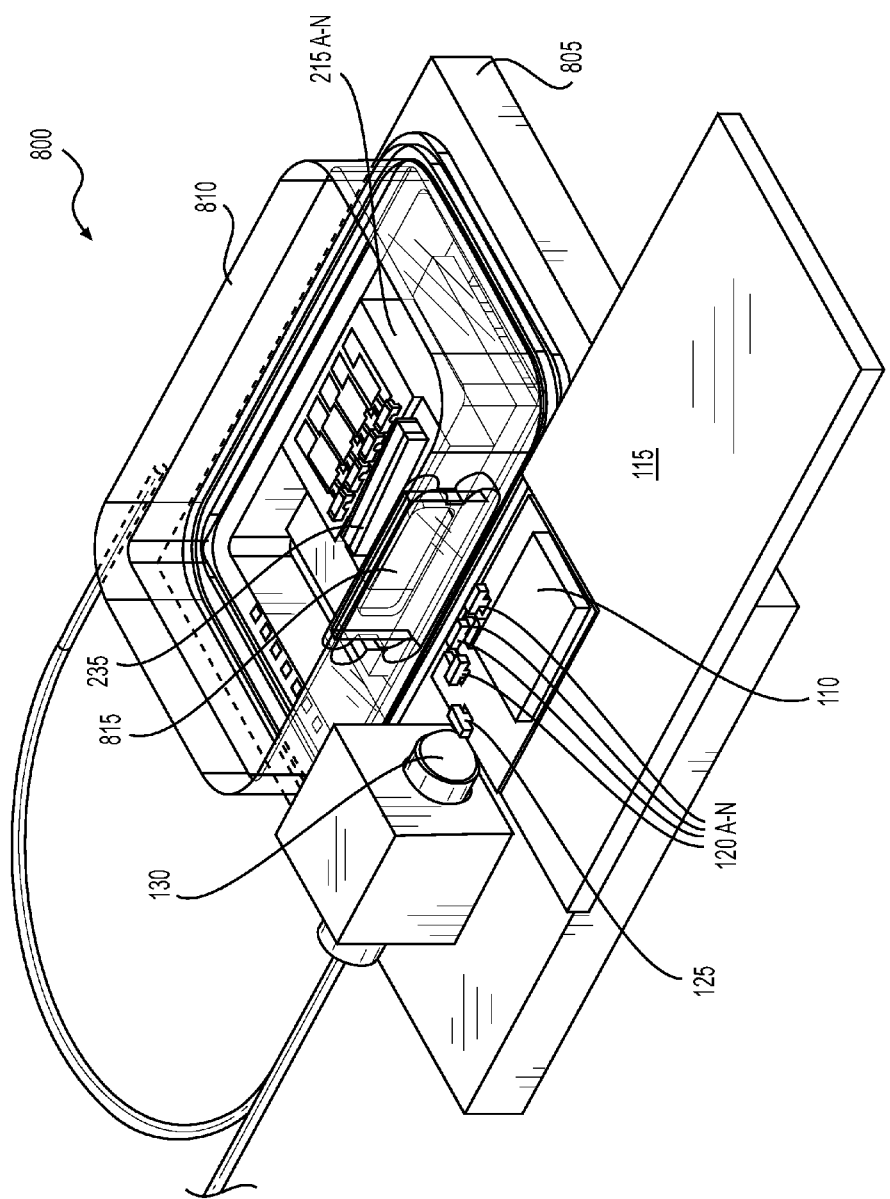
FIG. 8A illustrates a perspective view of an optical communication device with horizontal TEC mounting according to an implementation of the invention.
Figure 8B:
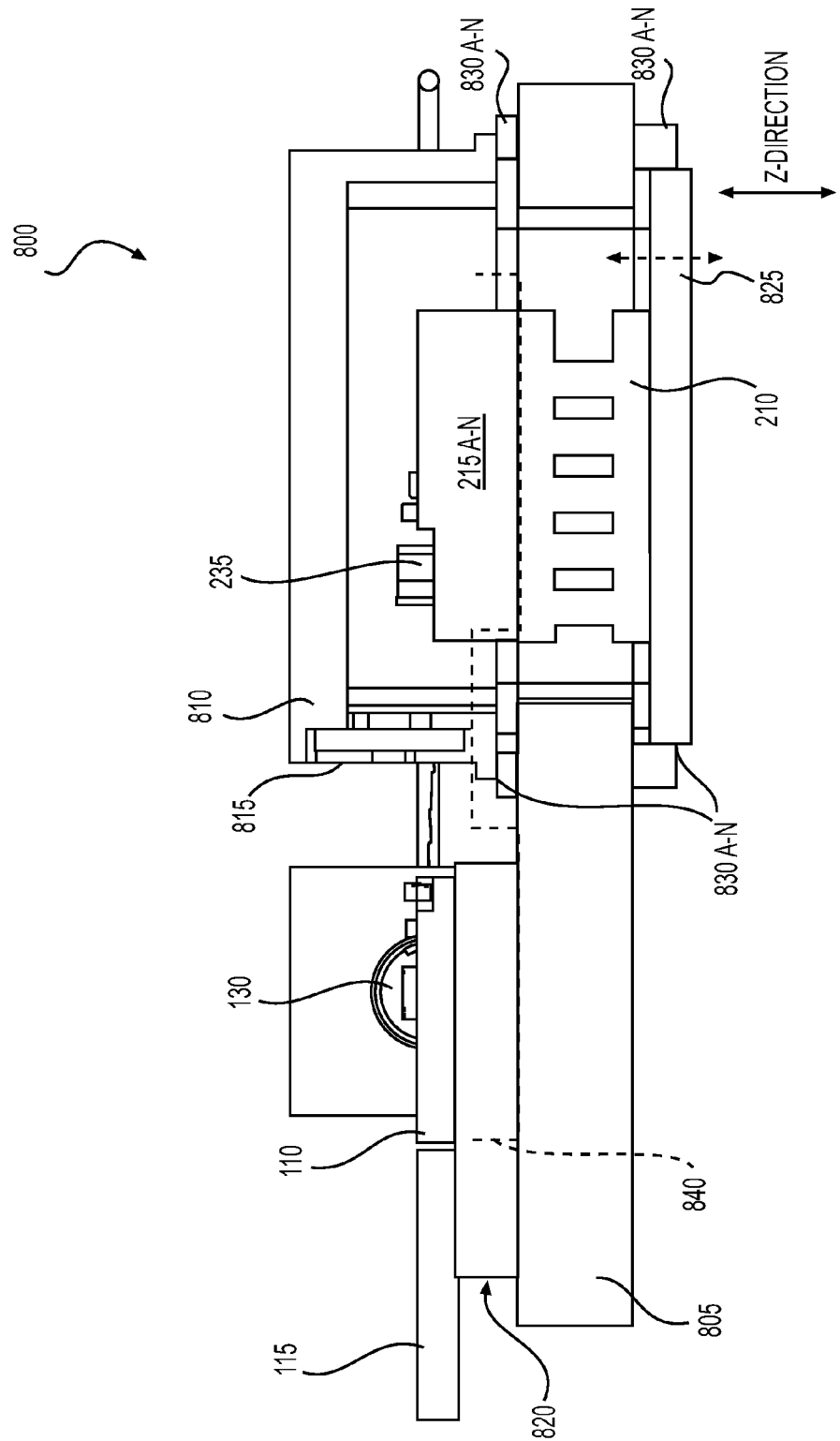
FIG. 8B illustrates a side view of the alignment of an optical communication device according to an implementation of the invention.

FIGS. 8A through 8B illustrate views of another optical communication device according to an implementation of the invention. In FIG. 8A, the optical communication device 100 comprises an optical bench/platform 805 and a hermetically sealed optical sub-assembly 800 similar to that shown in FIG. 1. However, in FIG. 8A, the optical sub-assembly 800 design varies. Specifically, as shown in greater detail in FIG. 8B, the TEC 210 in sub-assembly 800 is positioned horizontal relative to the modulator 110. Accordingly, sub-mounted lasers 215A-N (which may be mounted together or individually sub-mounted) are positioned on the top of the TEC 210 to provide heat dispersion required for the lasers. As noted previously, in some configurations the laser might not require a TEC 210 within the hermetically sealed sub-assembly 800, in which case the lasers would be height adjusted with a spacer as required to meet alignment with the window cap 815 positioned between the lasers 215A-N and the inputs 120A-N to the modulator 110. It is noted that even when lasers do not require a TEC 210, they still require a hermetically enclosed space, thus use of the present invention is applicable to un-cooled lasers as well as cooled lasers.

As shown in FIG. 8B, when a TEC 210 is utilized, height adjustments of the TEC 210 in respect to 805 and/or the modulator 110 may be made by placing the components using a tooling component (shown by dashed line 840 in FIG. 8B) and then welding the bottom lid 825 with the TEC 210 at the preferred height to metal ring 830 A-N. Additionally, FIGS. 8A-B illustrate that a second hermetic seal between 830A-N and 810 can be used to join the top metal lid 810 to the platform 805 (which, in this implementation, is multi-layer ceramic but may be any suitable material). Optionally, as shown in FIG. 8B, the modulator 110 and integrated circuit board 115 may be pre-adjusted height-wise by the use of a spacer 820, which may be machined as a part of the platform 805 or added afterwards during the manufacturing process. Also the brazed metal rings 830 A-N used in welding should comprise ceramic with inferior RF performance. Therefore, the RF routing should go directly to the PCB as opposed to being routed via the ceramic. This may be done with wire bonds. While the isolator 235 is shown inside the hermetically sealed sub-assembly 800, it may alternatively be located outside the hermetic enclosure 800 as discussed previously (if required at all). Further, as illustrated in FIGS. 8A-B, the inventive optical communication device 100 may be manufactured without the use of a standard TO-header, although it is economically preferable to use a TO header instead of hermetic ceramic feed-through package.

The operation of the optical communication device 100 shown in FIGS. 8A and 8B may be the same as that described previously. Specifically, a continuous light may be fired from the lasers 215A-N. While firing, the lasers 215A-N are cooled by TEC 210. The laser light is passed through lenses to collimate the light adjacent to the lasers and then focused outside the hermetically sealed optical sub-assembly 800, where they are coupled to the optical modulator 110. As previously discussed, an isolator 235 may be situated inside or outside the hermetically sealed assembly 800. The modulator 110 then modulates the laser light based on input from the PCB 115 and outputs the modulated signal to the optical network 130.

Figure 9A:
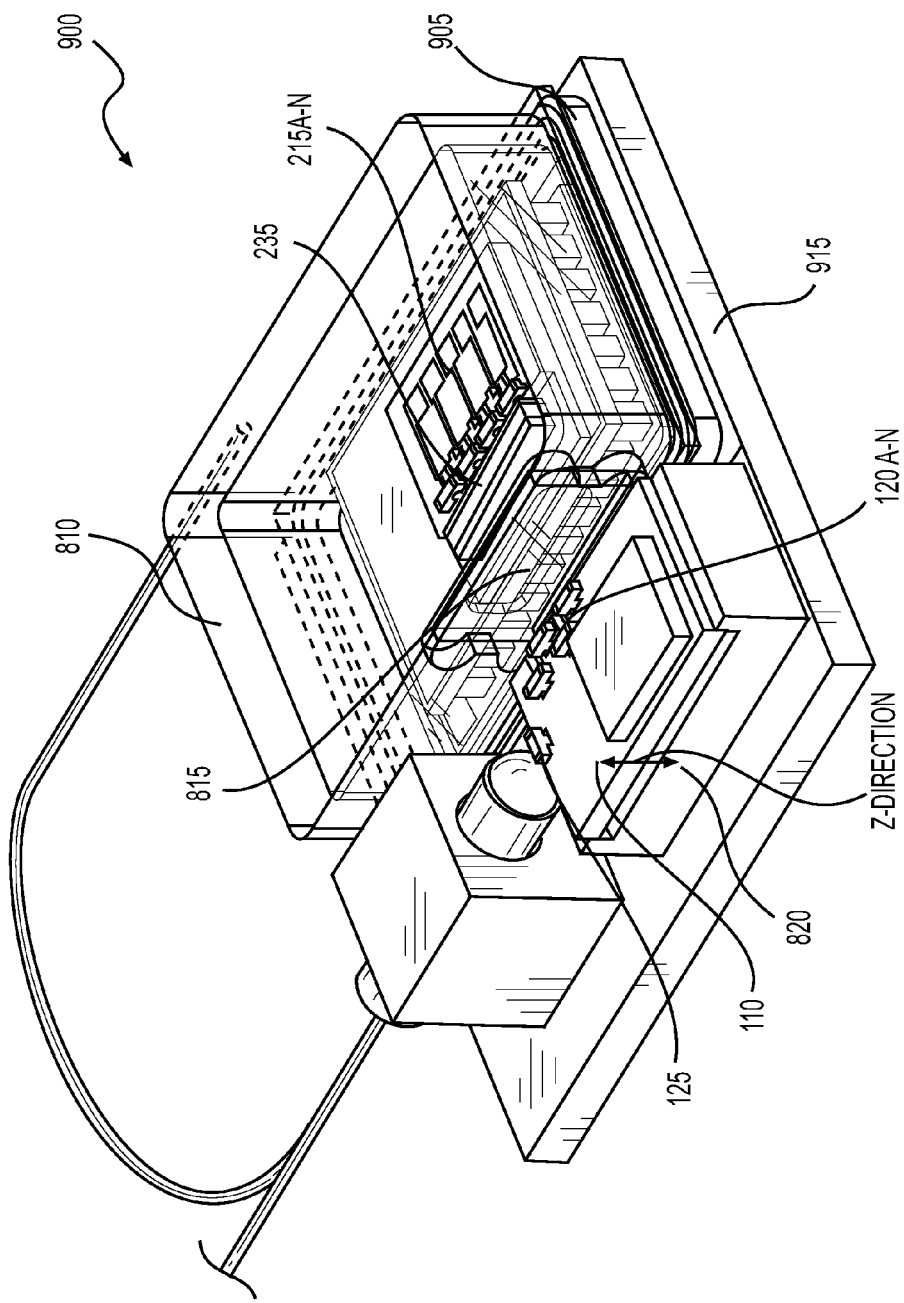
FIG. 9A illustrates a perspective view of an optical communication device according to an implementation of the invention.
Figure 9B:
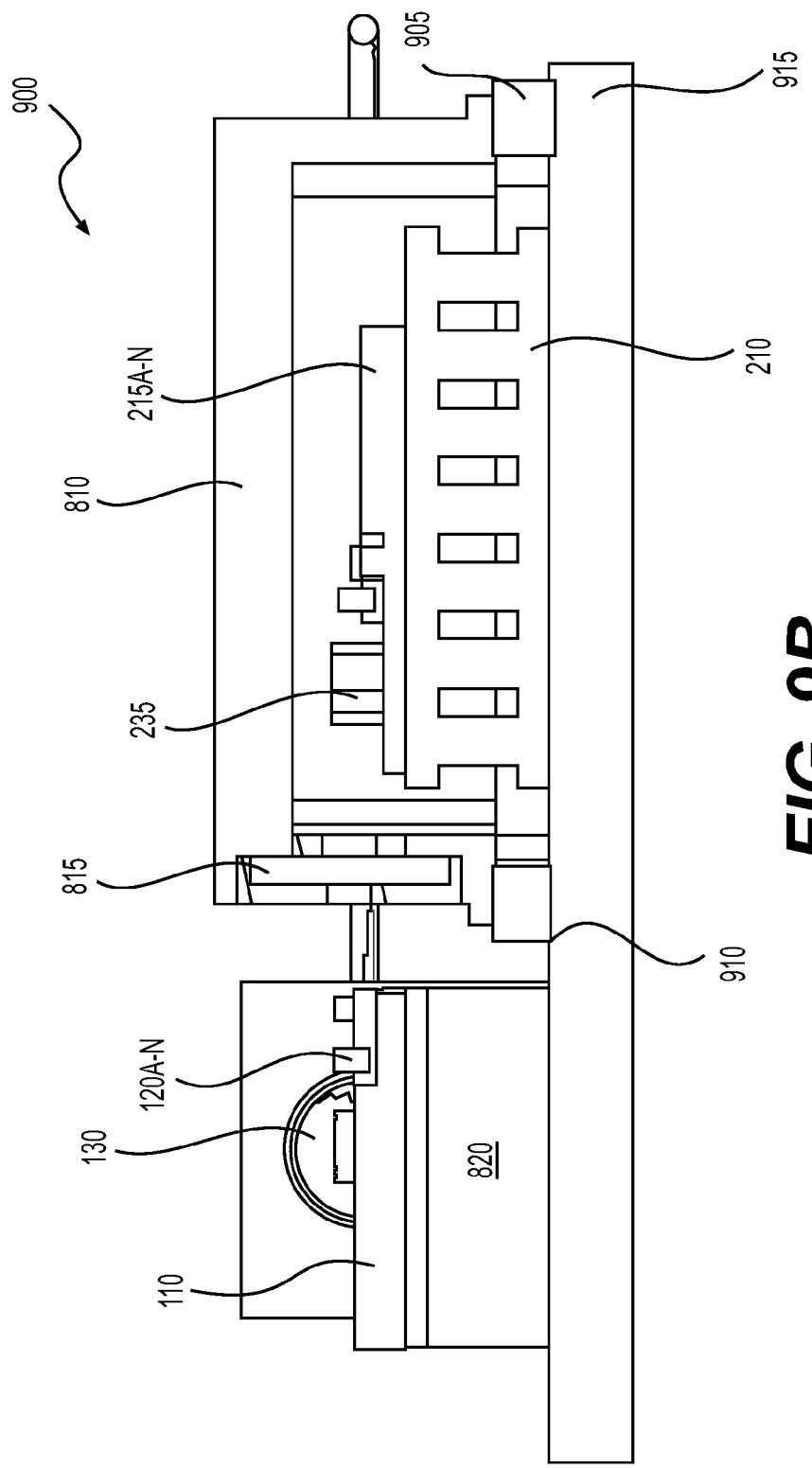
FIG. 9B illustrates a side view of the alignment of an optical communication device according to an implementation of the invention.

FIGS. 9A through 9B illustrate yet additional views of an optical communication device 100 according to another implementation of the invention. As shown in FIG. 9B, height tolerances may be adjusted in the optical sub-assembly 900 by adjusting distance/height between 110 and 820. With subsequent locking of 110 to 820 (e.g., via glue, welding, or solder), the modulator 110 (silicon photonic chip) could be sitting on an additional carrier (not shown) which is adjusted in respect to 820. Especially for the locking method "welding," this is preferred since the carrier material could be weldable kovar metal. Further, as with the implementation shown in FIGS. 8A-B, a spacer 820 may also be used to adjust other height adjustment on 110 side could be use of various shims in stepped-height variations tolerances between the output of the sub-assembly 900 and the input(s) 120A-N to the modulator 110. (Similarly, height adjustments (instead of modulator height adjustments) could likewise be done inside hermetic area 810 between laser sub-mount 215A-N and TEC 210 (not shown)). In either case as before, a window cap 815 is employed to allow communication between the hermetically sealed lasers 815A-N and the modulator 110 (which in turn may send signals to an optical network through optical interface 130).

As discussed previously, the various implementations disclosed herein offer advantages over conventional designs. Such advantages include increased power performance (lower power consumption), more economical packaging designs, and potentially smaller device sizes. This list is not exclusive, but includes other advantages recognized by those of ordinary skill in the art.

Figure 10:
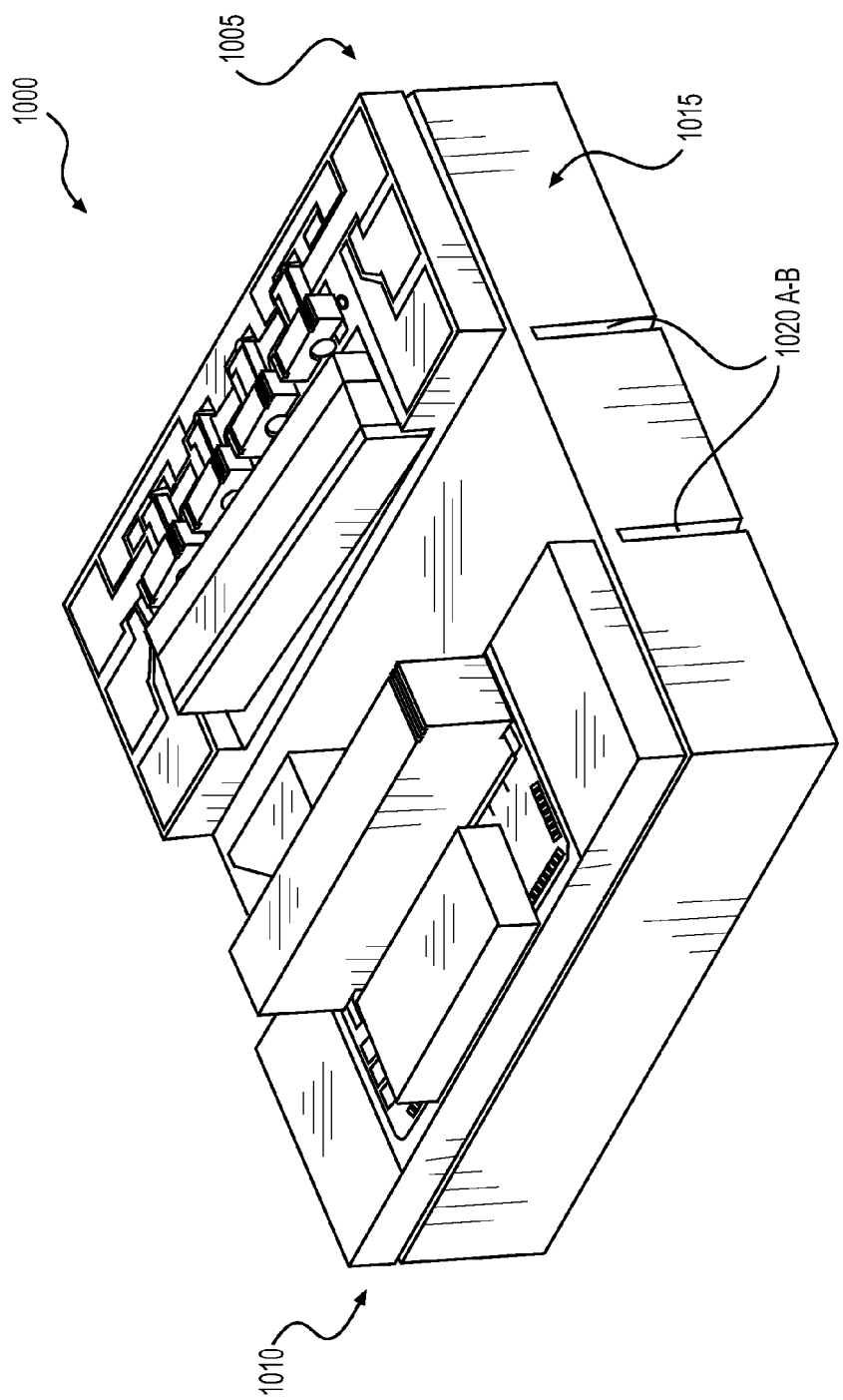
FIG. 10 illustrates a wafer configuration with pre-defined breaks according to an implementation of the manufacture of the invention.

The present disclosure also provides an inventive method of manufacturing the inventive optical communication device 100. FIG. 10 illustrates a subassembly consisting of carrier 1015, 1010 and 1005. A singulated sub-assembly is shown, but it could be part of a wafer scale assembly (i.e., a wafer of many carriers 1015). Carrier 1015 has pre-defined breaks 1020A-B according to an implementation of the manufacture of the invention. Such breaks 1020A-B ensure easy separation of modulator 1010 and laser section 1005 in subsequent process steps. Wafer scale assembly can have cost and handling advantages. An additional advantage is pairing up of specific laser sub-mounts and modulators. The pairing can be kept throughout the whole process resulting in easier optical alignment process and better final optical coupling. For example, the modulator 1010 and laser sub-mount 1005 can be aligned approximately adjacent to the breaks as shown. The complete subassembly 1000 can then be attached to the optical bench and header simultaneously and separated afterwards using pre-defined break lines 1020A-B. This manufacturing process allows sealing of the laser sub-mount portion without having the modulator in close proximity and in limited tooling access (as shown in FIGS. 13B-E).

Figure 11:
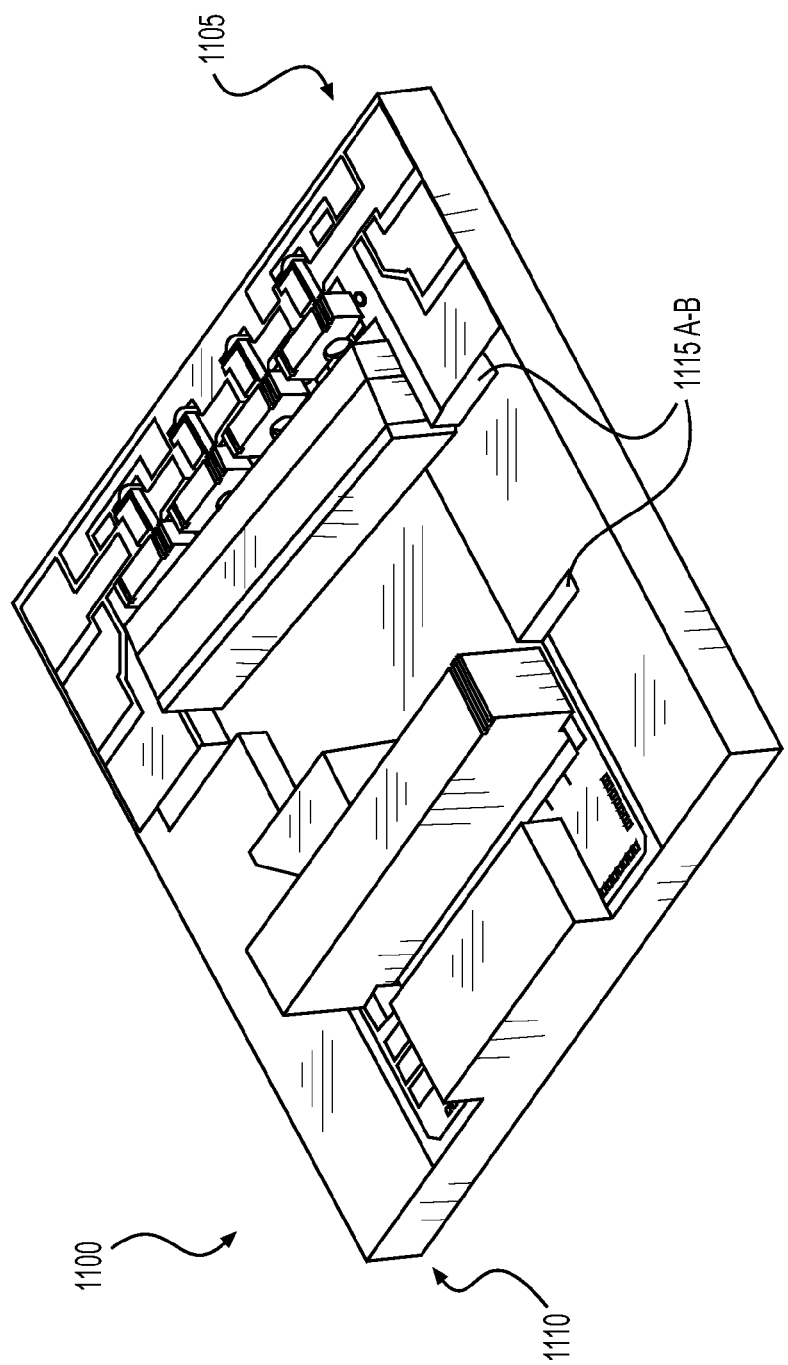
FIG. 11 illustrates a silicon photonics chip (e.g., sub-mount) with pre-defined breaks according to an implementation of the manufacture of the invention.

FIG. 11 illustrates a subassembly 1100 with pre-defined breaks 1115A-B according to another implementation of the manufacture of the invention. Similar to the implementation shown in FIG. 10, the breaks 1115A-B allow for separation of laser portion 1105 and modulator portion 1110 in subsequent process steps. However, in this implementation, a larger single silicon chip 1100 encompasses both portions, eliminating the need for additional carrier 1015.

Figure 12A:
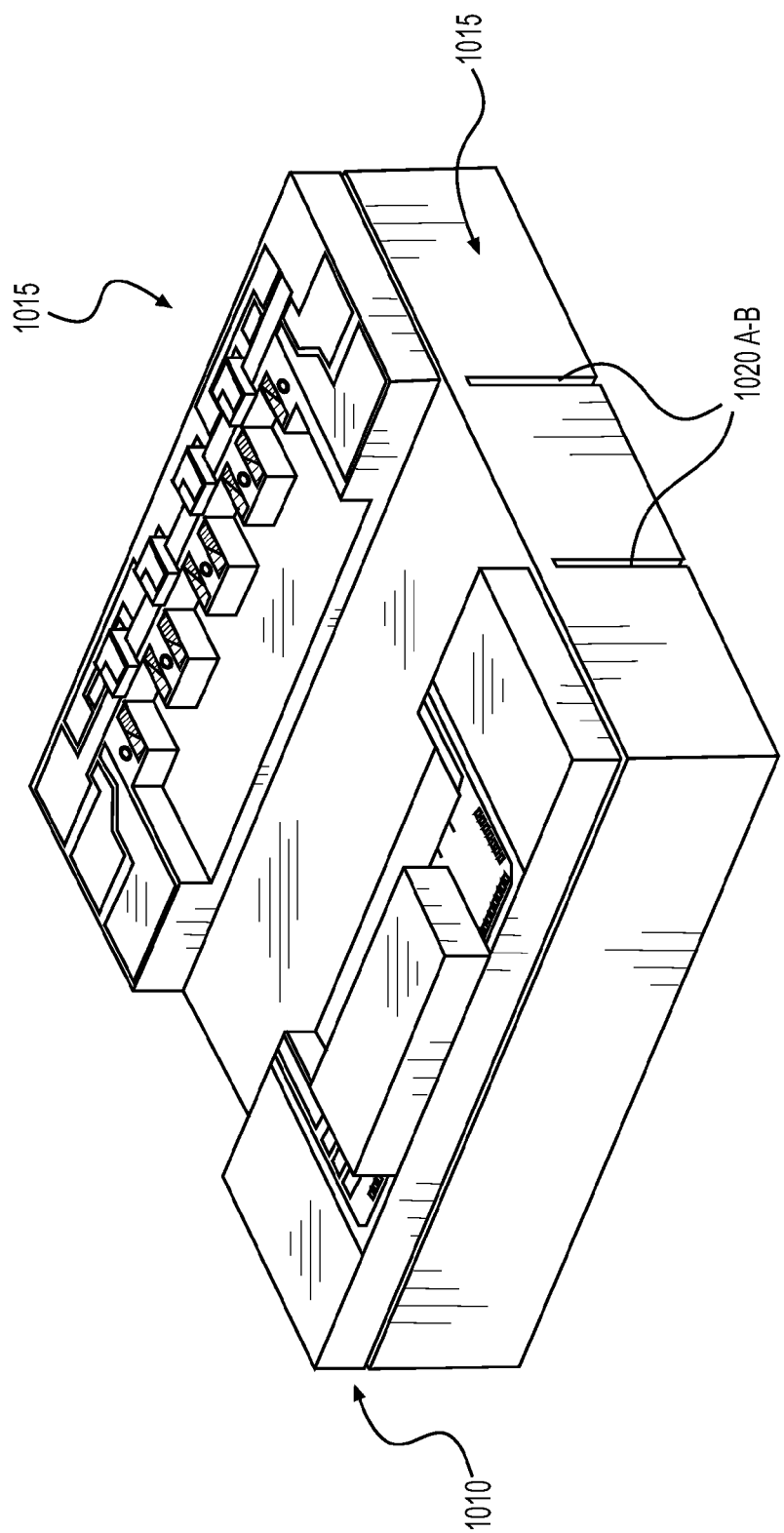
FIG. 12A illustrates a silicon photonics chip and laser sub-mount mounted to a carrier wafer configuration with pre-defined breaks according to an implementation of the manufacture of the invention.

As shown in FIGS. 12A through 12B, if two separate sub-mounts are used (e.g., a laser sub-mount 1005 and a modulator 1010), a subassembly 1015 with pre-defined breaks 1020A-B according to an implementation of the manufacture of the invention may be aligned using a tool 1205. In FIG. 12A the two sub-mounts in a first, course align step are placed approximately aligned with the pre-defined breaks 1020A-B. Proper height alignment between the sub-mounts is guaranteed by bond line control between 1015 and 1010 and between 1015 and 1005. However, to ensure proper side-to-side alignment, in one implementation a jaw tool 1205 may be inserted into the space between the sub-mounts and opened as shown in FIG. 12B to position the two individual sub-mounts. (The jaw tool references off of the precision etched features on sub-mounts 1005 and 1010). As shown, this may be performed after laser attach and burn in for 1005 but before the final placement of specific components such as the isolator the modulator and laser lenses. However, such tooling could be performed at any time prior to final attachment of the sub-mounts.

Figure 17A:
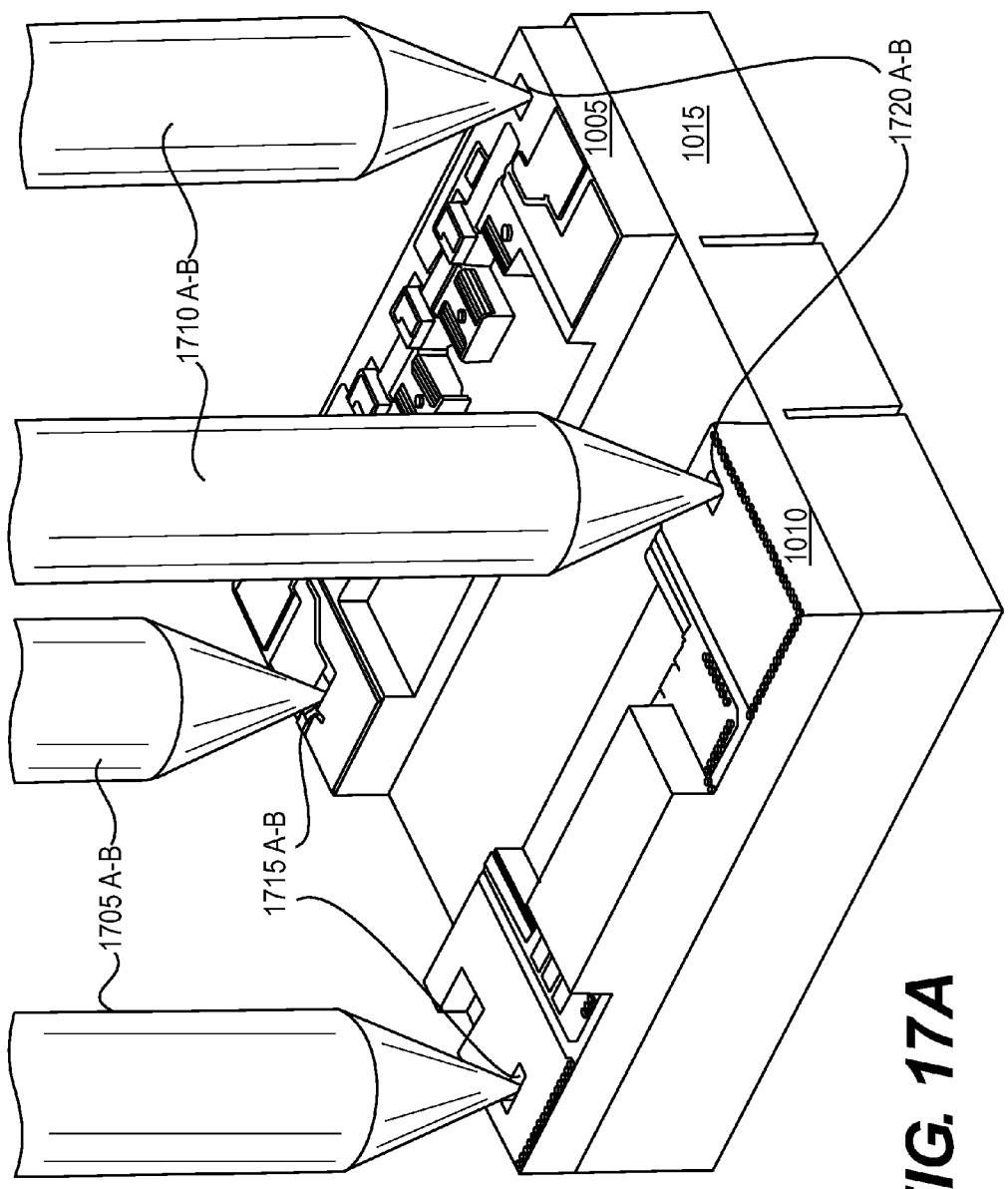
FIGS. 17A-B illustrate a silicon photonics chip and laser sub-mount mounted to a carrier wafer configuration with pre-defined breaks according to another implementation of the manufacture of the invention.
Figure 17B:
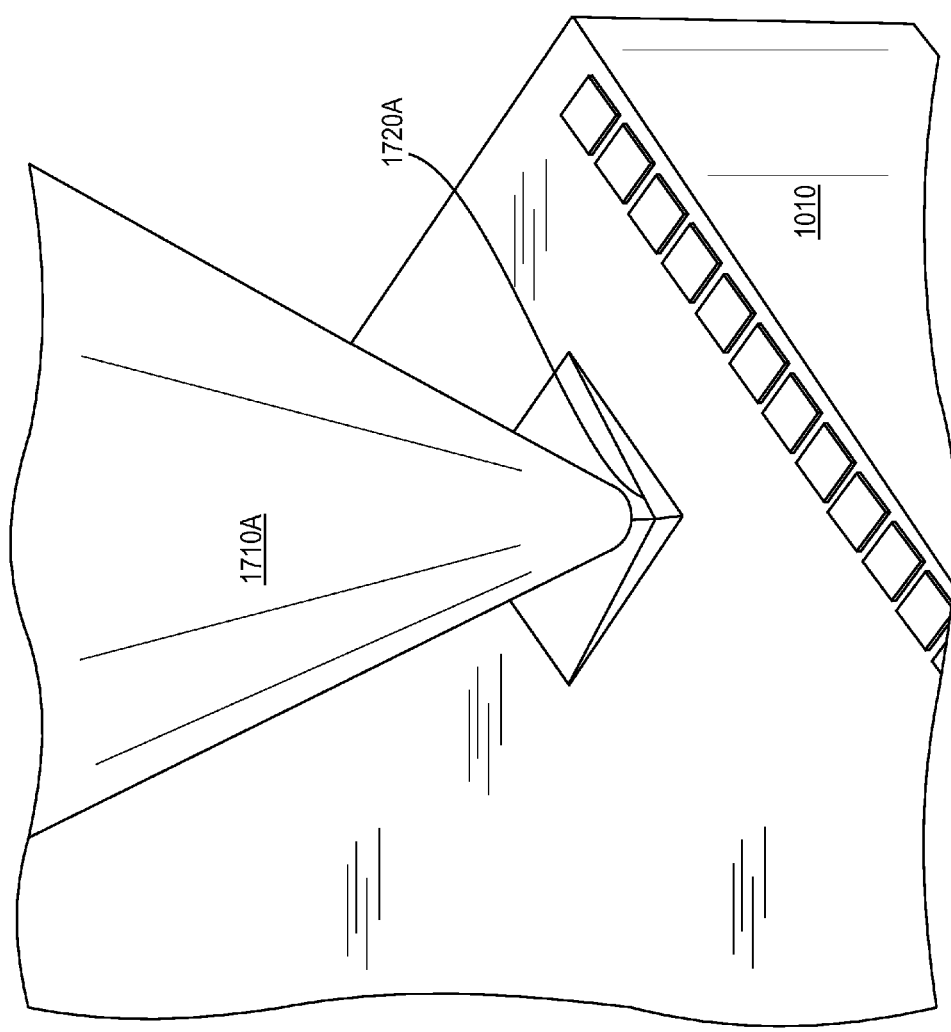

Similarly, FIGS. 17A through 17B illustrate another method of aligning the laser sub-mount section 1005 and modulator section 1010. As shown, a first tool 1705A-B may be inserted into slots 1715A-B manufactured into the sub-mount section 1005 and modulator section 1010, thus providing angular alignment. At the same time, a second tool 1710A-B may be inserted into inverted pyramids 1720A-B. The combination of the second tool 1710A-B, which preferably comprises two elongated columns (e.g., conical pins in a collet used to hold the component), each ending in a pyramid or pointed shape, allows for proper lateral alignment when placed into the inverted pyramids 1720A-B. This is shown in detail in FIG. 17B, as second tool 1710A is pressed into the inverted pyramid slot 1720A that is machined or chemically etched into the modulator section 1010.

Figure 13B:
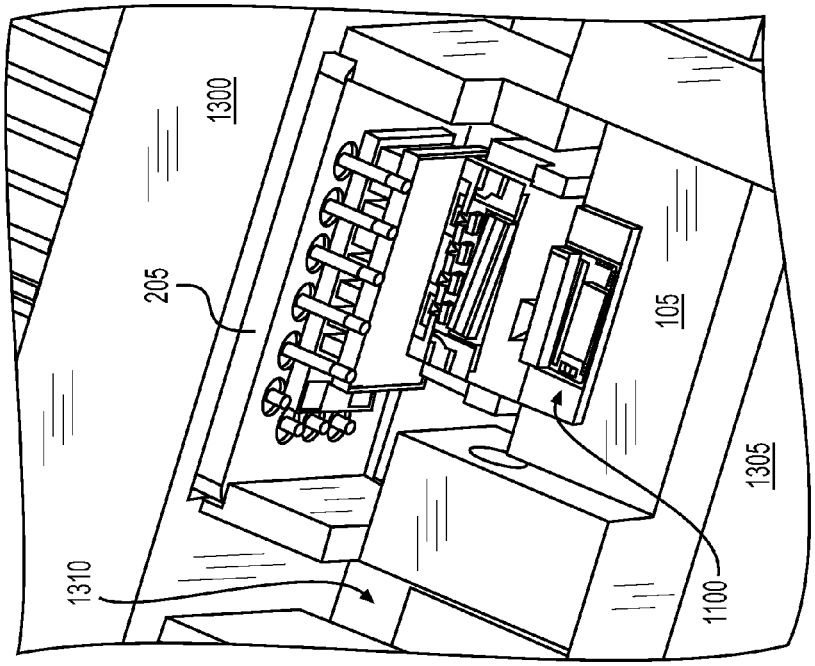
FIGS. 13A-E illustrate the tooling of an optical communication device according to an implementation of the manufacture of the invention.
Figure 13A:
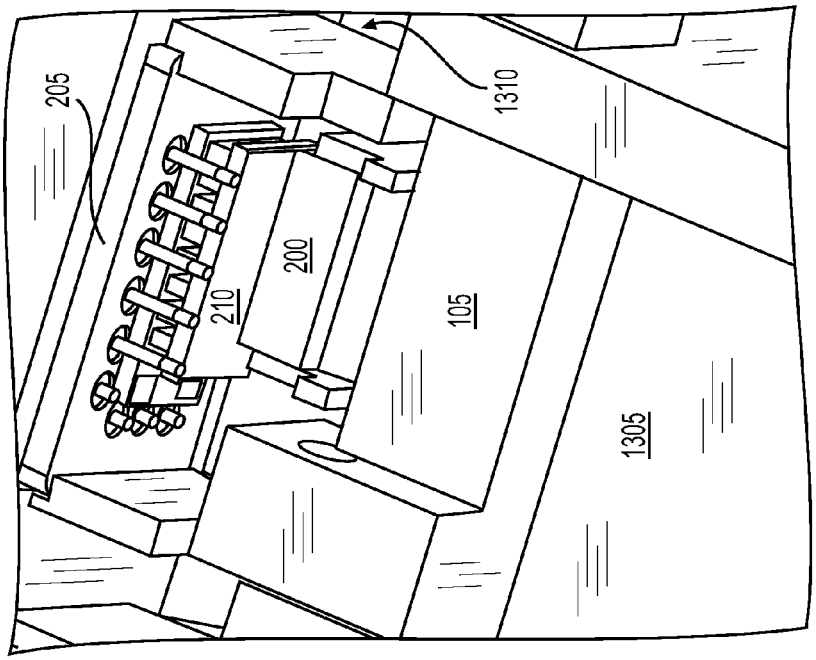

FIGS. 13A through 13E illustrate further tooling of an optical communication device 100 according to an implementation of the manufacture of the invention. In FIG. 13A, a pre-formed tool 1305 holds the optical platform 105 in place against a header 205 (that is stationary during the tooling process). A second tool 1310 provides proper course alignment for placing the sub-mount or carrier wafer. In FIG. 13B, a subassembly 1100 with pre-formed breaks (as discussed above with reference to FIG. 11)—or alternatively a wafer 1015 pre-formed with breaks (as discussed above with reference to FIG. 10)—is positioned on top of the space next to the thermo-cooler 210 and on top of the optical platform 105. At this point epoxy may be used to secure the sub-mount 1100 to the spacer 220 and optical platform 105. Curing can be performed in the fixture.

Figure 13D:
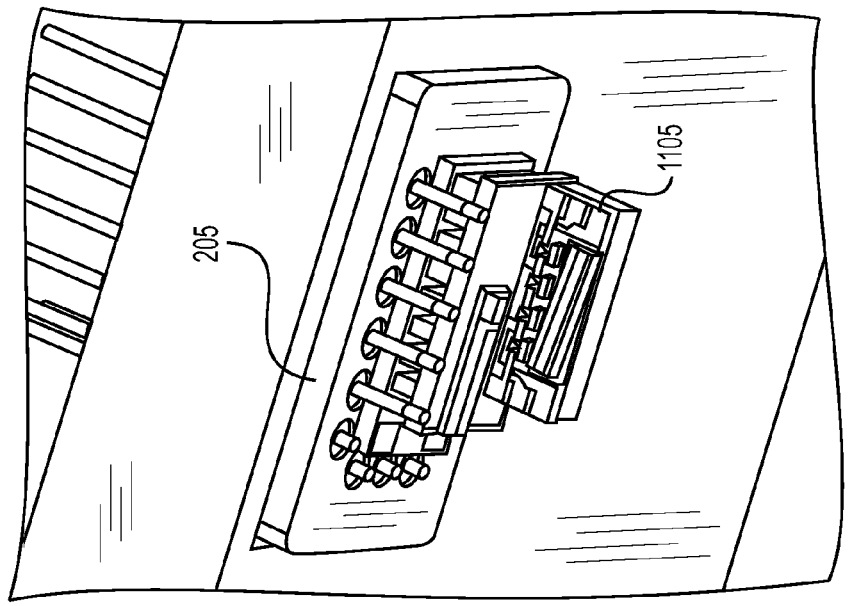
Figure 13C:
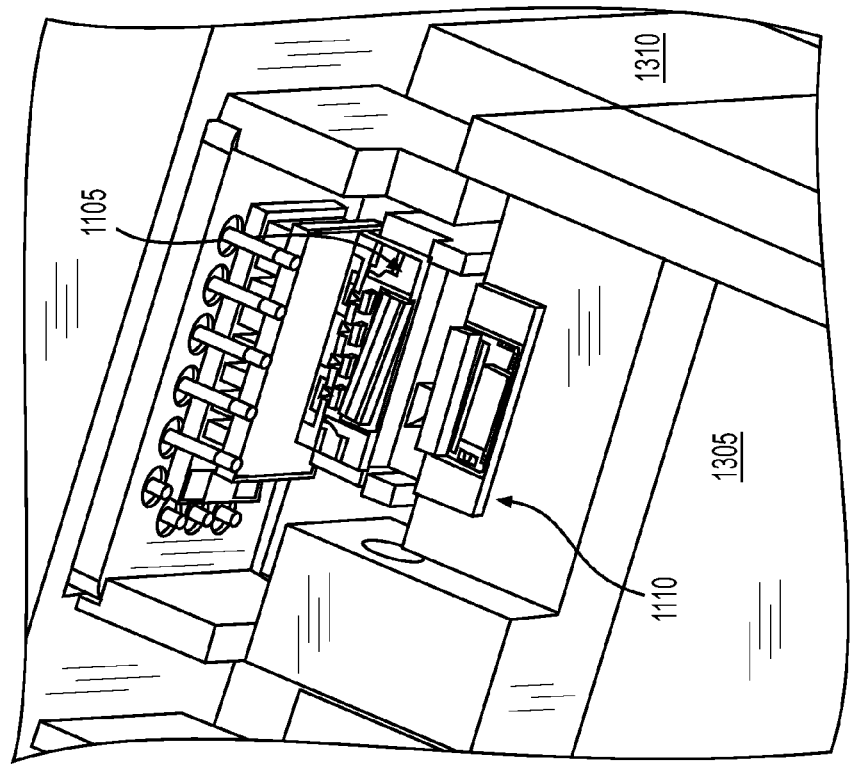
Figure 13E:
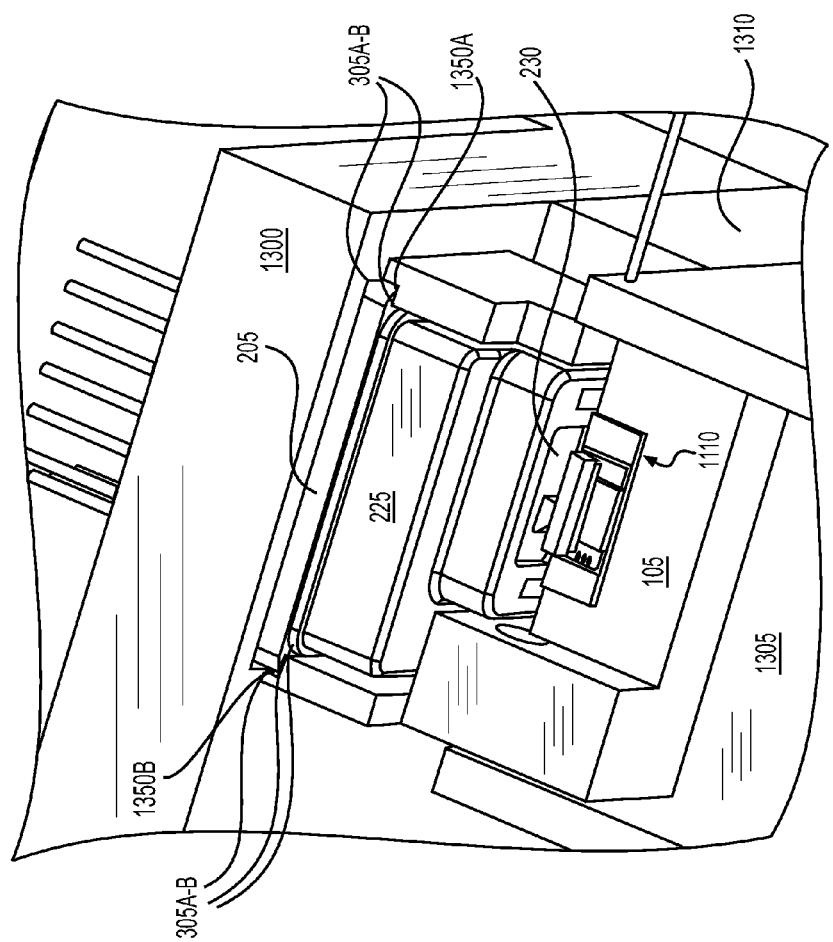

After cured, the portion of the subassembly 1100 between the breaks is broken (i.e., cracked) under controlled conditions. This may be performed by a controlled tooling split or controlled stress exposure to a weak area of the sub-mount. Whatever the case, the middle portion of the sub-mount 1100 (or wafer, if using a wafer configuration) can be removed or will fall away, as shown in FIG. 13C. Next, as illustrated in FIG. 13D, the tooling members 1310, 1305 have been removed, along with the optical platform 105, thus leaving the header 205 stabilized in the fixture with the TEC 210, laser sub-mount 1105, and spacer 220. With this increased access, a thermistor 1320 may be added for heat monitoring and wire bonding may occur.

Following the completion of the wiring of the laser sub-mount 1105 according to FIG. 13D, a hermetic sealing step (either projection weld or laser seam sealing) will secure the front cover 225 of the optical sub-assembly 200 to the header 205. Tooling member 1305 and tooling member 1315 may be used during this step. As previously described, the optical sub-assembly comprises a window cap 230 for sending laser light/signals. At this time, the enclosure of the sub-assembly 200 can be hermetically sealed by soldering or welding around the joint between the front cover 225 and the TO-header 205. After sealing 225 to 205, tooling 1305, 1310 and 1300 are joined together again. Notably, splitting and re-joining of 1305, 1310 and 1300 can be done repeatedly and precisely if designed right such that optical coupling between 1005 and 1010 is maintained without additional active re-alignment. Finally optical bench 105 and header 205 can be joined at interface 1350A and 1350B to secure alignment permanently (attach methods could be soldering, laser welding or adhesive attach). The optical communication device 100 can then be removed from the clasp and additional parts (such as a PCB board and optical connector) can be added as required.

Optionally, one way of joining header 205 to optical bench 105 is to rely on tooling maintaining the optical alignment between 1005 and 1010. This could be advantageous during manufacturing because it is faster and less expensive due to the avoidance of additional alignment steps. However, because optical coupling could be compromised, there could be applications where this is acceptable, while other applications are less forgiving and require highest possible coupling. In those cases, after sealing of front cover 225 to header 205, an additional active multiple access alignment step could be required between header 205 and optical bench 105 before both parts are joined at interface 1350A and 1350B.

Figure 14A:
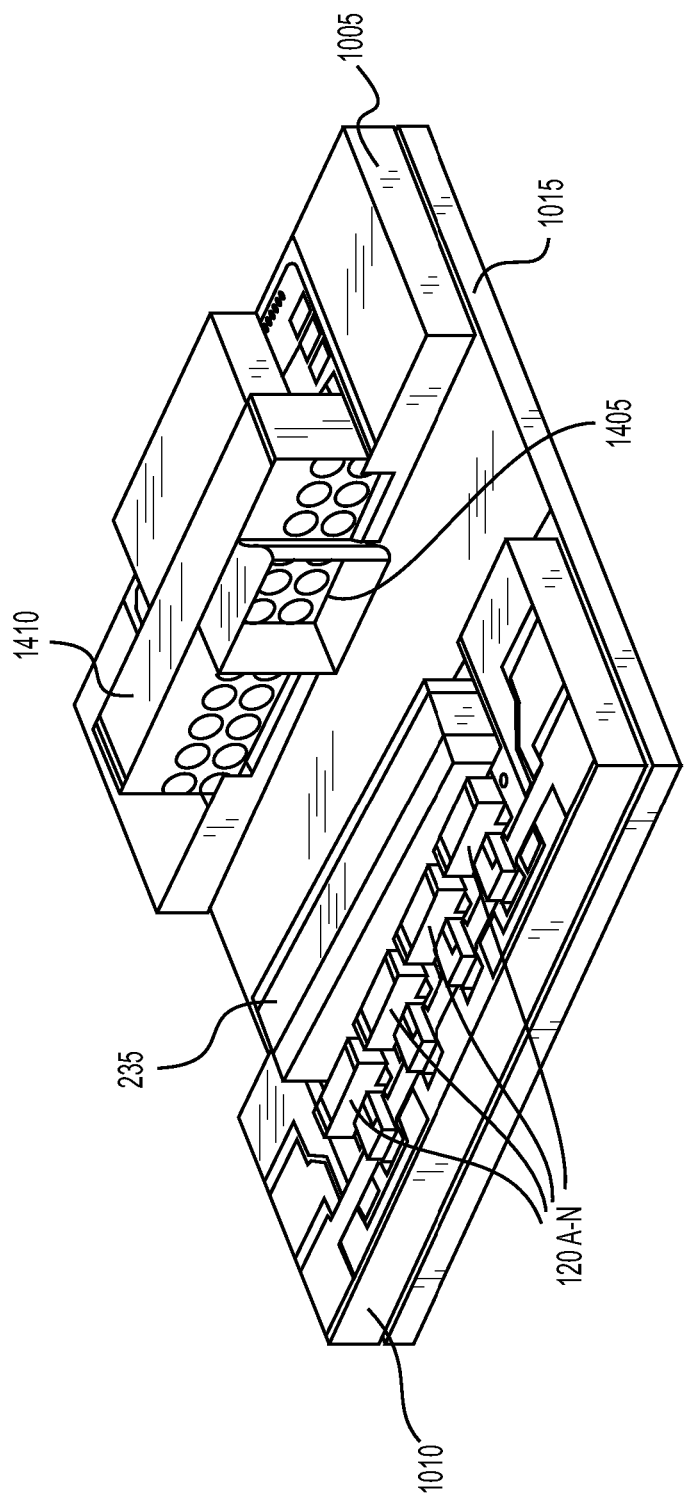
FIGS. 14A-B illustrate the flow of signals in an optical communication device according to an implementation of the invention.
Figure 14B:
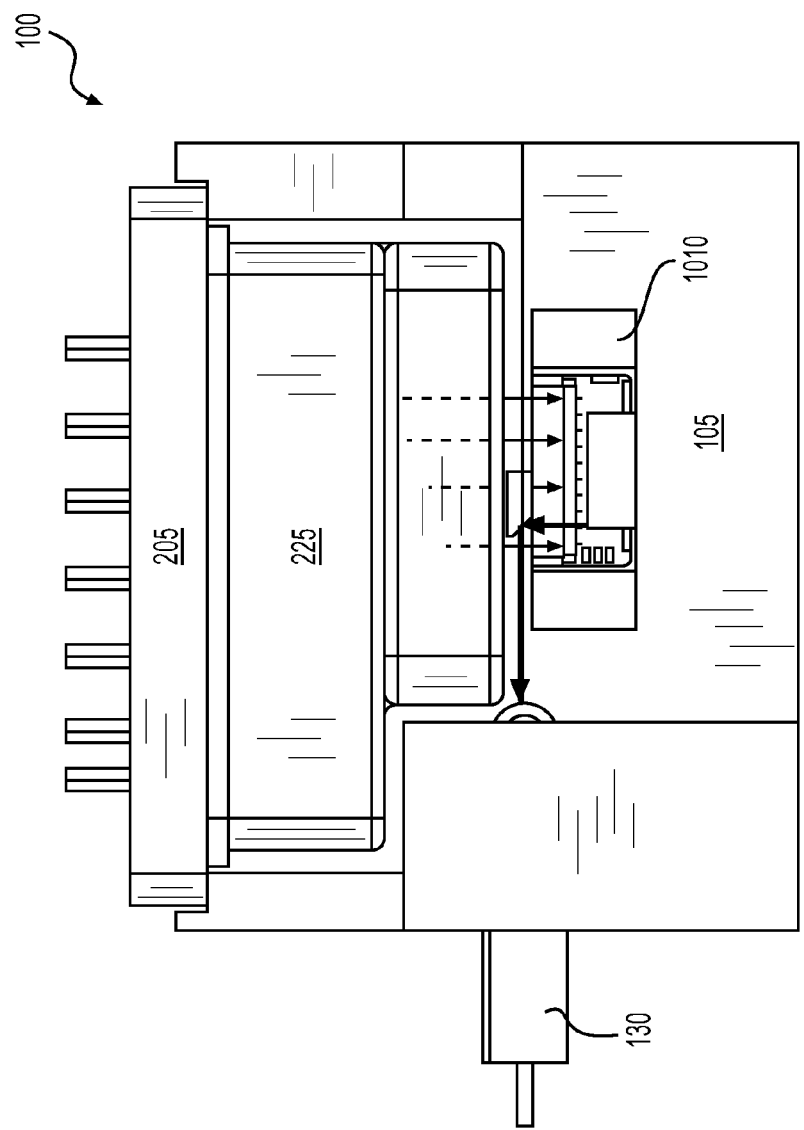

In yet another implementation of the inventive optical communication device 100 shown in FIGS. 14A-B, an input lens array 1410 could be used in combination with an angled reflector 1405 to direct the optical signals into and out of the modulator 1005. The input array 1410 receive lasers light (here shown as receiving four laser beams as dashed lines) from the laser sub-mount. The modulator 1005 would then modulate the light (by encoding data and multiplexing) the laser inputs and would in turn send a single light beam to the optical network. In FIG. 1, the laser output lens (or lenses) 125 for the modulator 110 may be placed proximate to the optical connector 130. However, as shown in FIG. 14B, this may also be done by using an angled reflector that bends the light 90 degrees and directs it to the optical interface/receptacle 130 that interfaces with the optical network. As such, various implementations are envisioned for processing laser signals once coupled to the modulator 110, and the specific steps of processing performed by a photonic modulator 110 are not mandated by this disclosure. As such, the inventive optical communication device 100 is not limited to any specific type or method of optical processing.

Figure 15A:
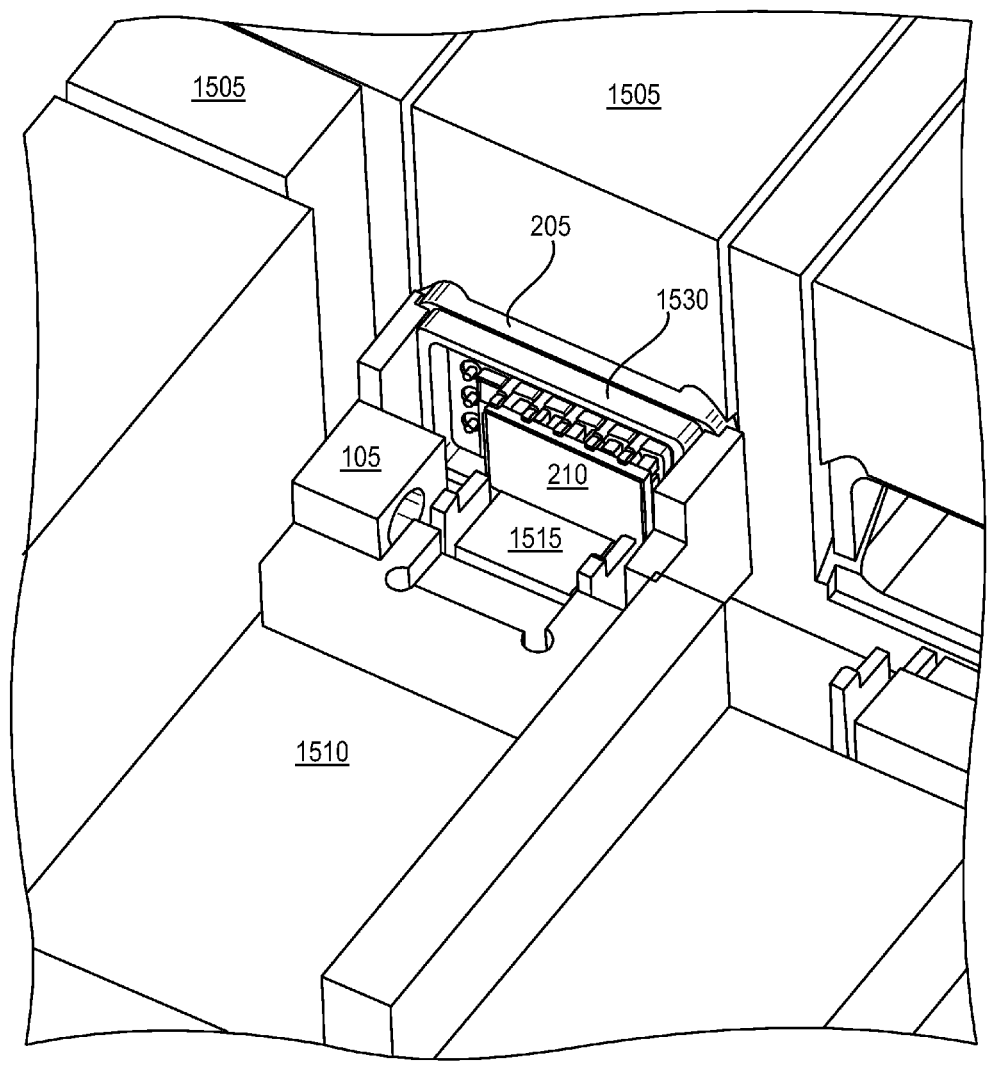
FIGS. 15A-E illustrate the tooling of an optical communication device according to another implementation of the manufacture of the invention.

FIGS. 15A-E illustrate yet another tooling of an optical communication device 100 according to an implementation of the manufacture of the invention. In FIG. 15A, a pre-formed tool 1505 holds the optical platform 105 in place against a header 205 (that is stationary during the tooling process). A second tool 1515 provides proper course alignment for placing the sub-mount or carrier wafer.

Figure 15B:
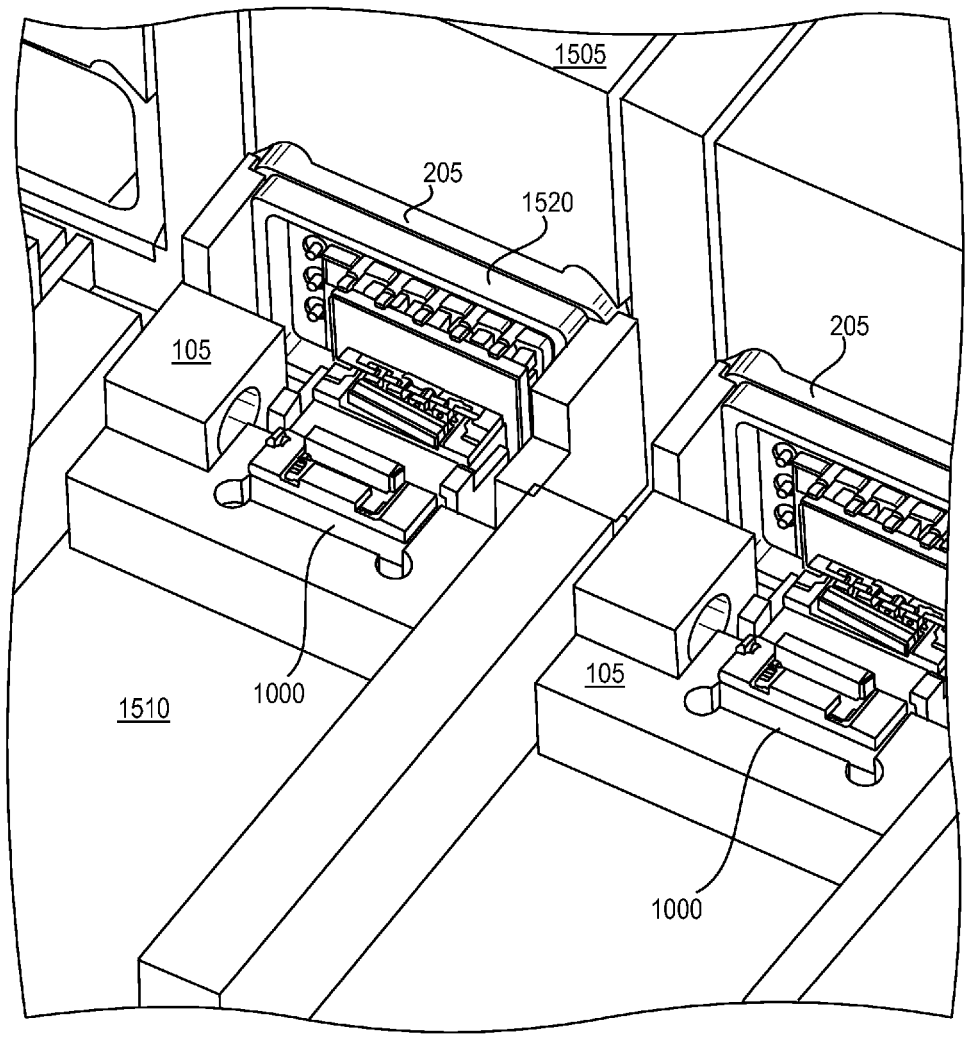

In FIG. 15B, a wafer 1000 with pre-formed breaks (as discussed above with reference to FIG. 10)—or alternatively a silicon chip with pre-formed breaks (as discussed above with reference to FIG. 11)—is positioned on top of the space next to the thermo-cooler 210 and on top of the optical platform 105. As shown, the optical platform 105 has a pre-formed area to insert a modulator 1000 for proper alignment. At this point epoxy may be used to secure the wafer 1100 (with sub-mount portions) to the TEC 210 and optical platform 105. Curing can be performed in the fixture.

Figure 15C:
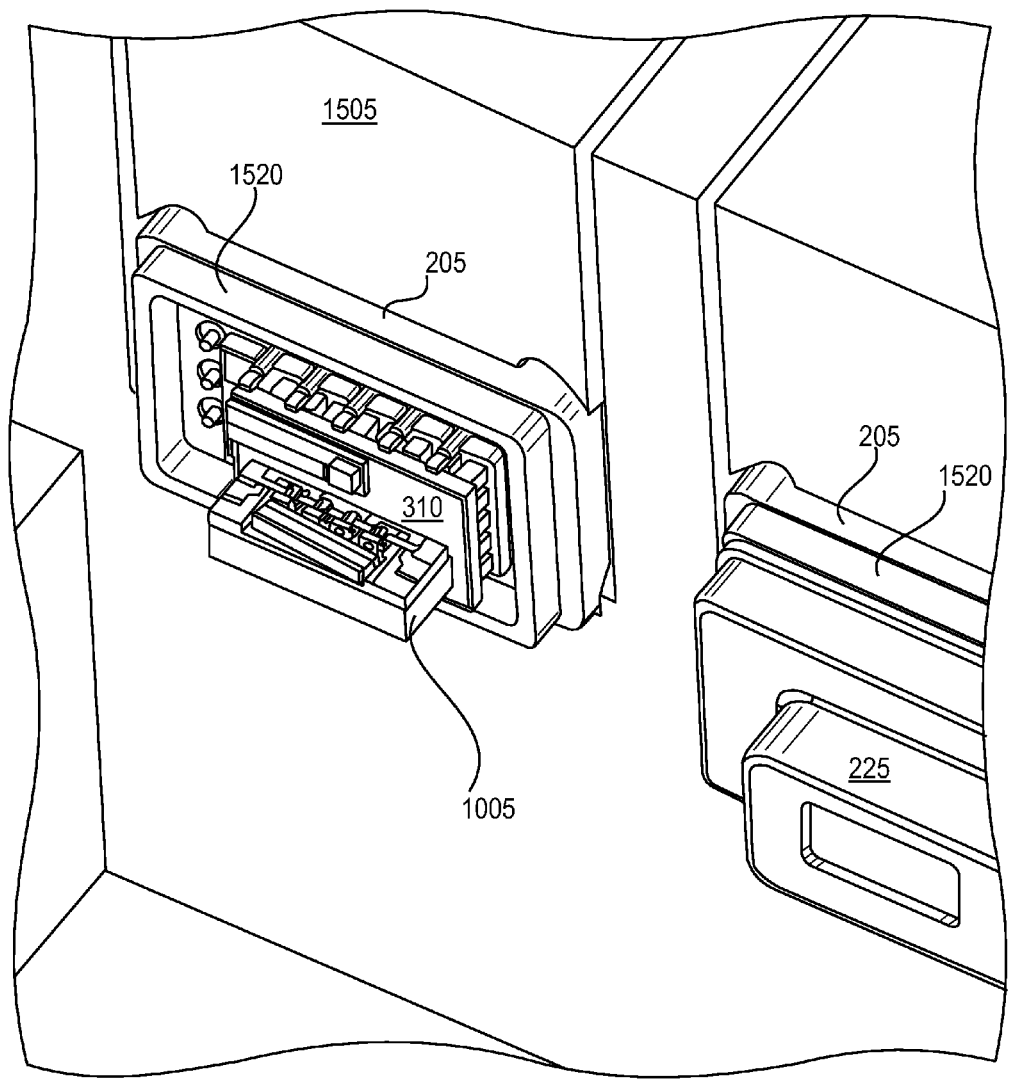

After cured, the portion of the wafer 1000 between the pre-formed breaks is cracked under controlled conditions. This may be performed by a controlled tooling split or controlled stress exposure to a weak area of the sub-mount. Whatever the case, the middle portion of the wafer 1000 (or chip, if using a silicon sub-mount configuration) can be removed or will fall away, as shown in FIG. 15C. The tooling members 1510 and 1515 are then removed, along with the optical platform 105, leaving the header 205 stabilized in the fixture with the TEC 210 and laser sub-mount portion 1005. With this increased access, a thermistor may be added for heat monitoring and wire bonding may occur.

Figure 15D:
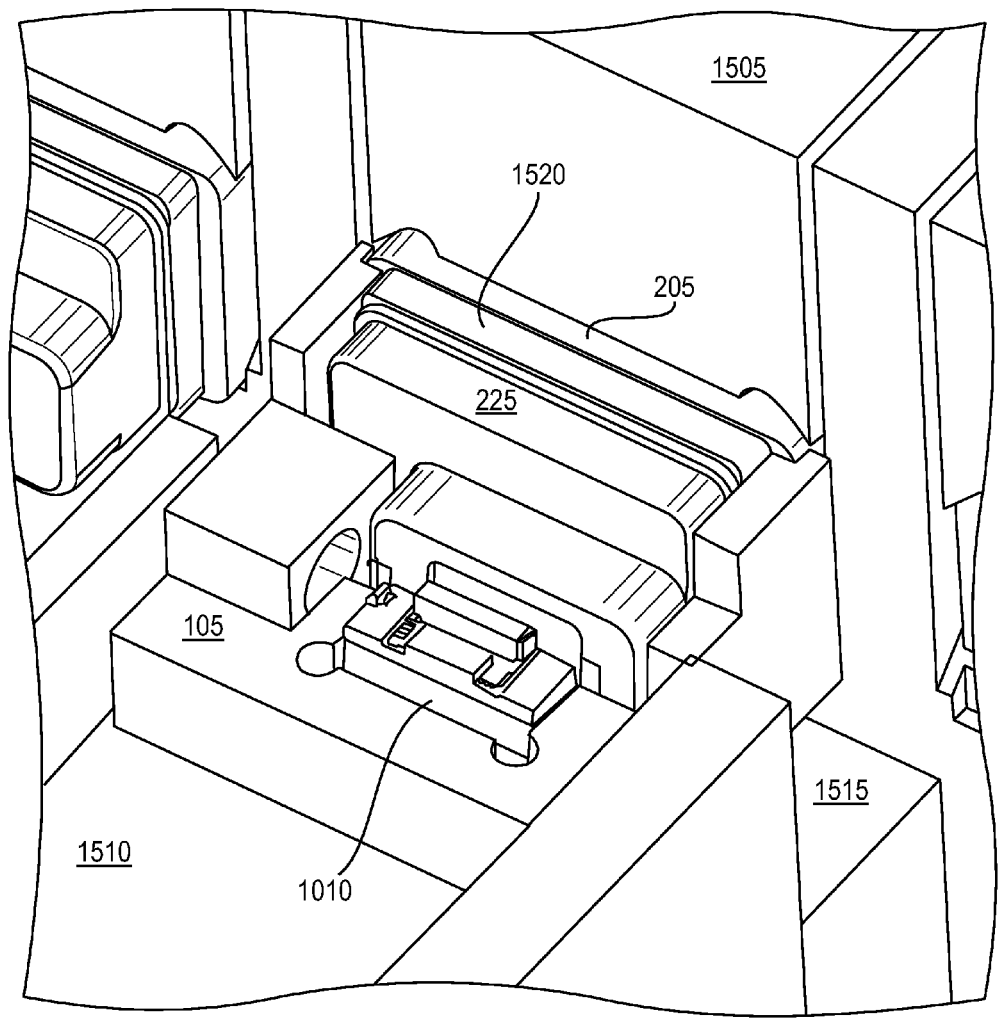

Following the completion of the wiring of the laser sub-mount portion 1005, a hermetic sealing step (either projection or weld or laser seam sealing) will secure the front cover 225 of the optical sub-assembly 200 to the header 205 as shown to the right in FIG. 15C. Tooling member 1510 and tooling member 1515 may then be re-inserted as shown in FIG. 15D. Notably, splitting and re-joining of tooling members 1505, 1510 and 1515 can be done repeatedly and precisely if designed right such that optical coupling between sub-mount portions 1005 and 1010 is maintained without additional active re-alignment.

Figure 15E:
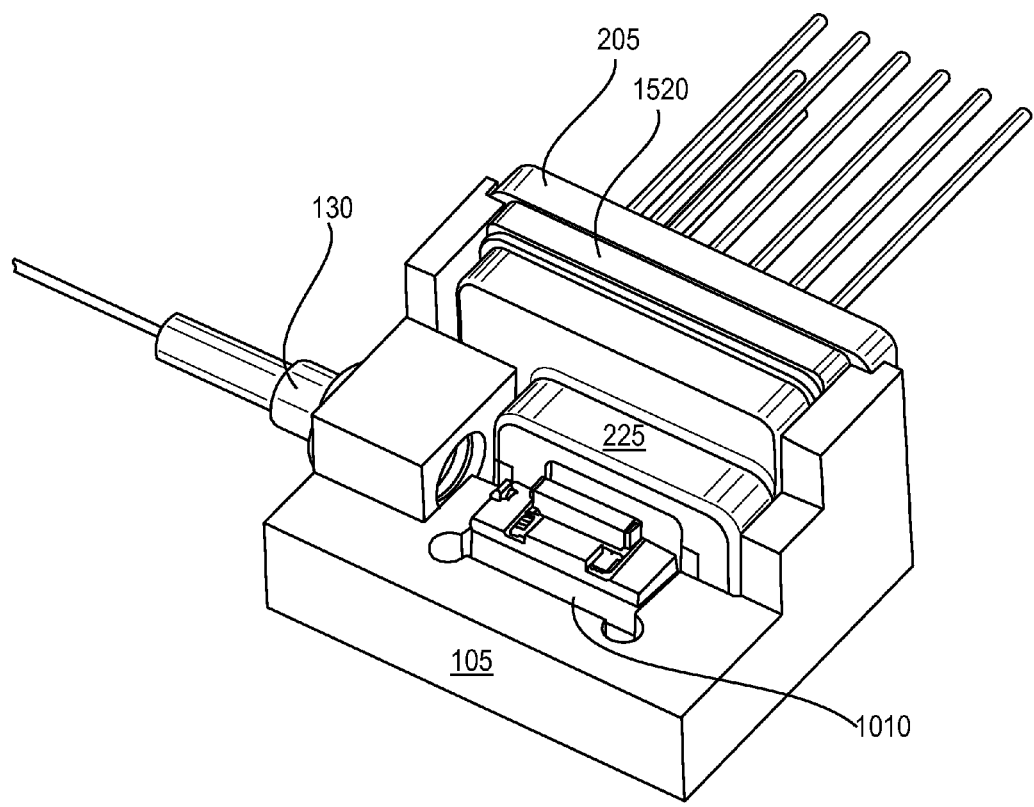

As previously described, the optical sub-assembly comprises a window cap 230 for sending laser light/signals. As shown in FIG. 15C, right side, the enclosure of the sub-assembly 200 can be hermetically sealed by soldering or welding around the joint between the front cover 225 and the TO-header 205. After sealing cover 225 to header 205, tooling members 1505 and 1510 and 1515 are joined together again. Finally optical bench 105 and header 205 can be joined at their interfaces to secure alignment permanently (attach methods could be soldering, laser welding or adhesive attach). The optical communication device 100 can then be removed from the clasp and additional parts (such as a PCB board and optical connector) can be added as required as shown in FIG. 15E.

As noted, the optical communication device 100 may comprise a number of different implementations. FIG. 16A illustrates yet another example of the optical communication device 100 according to another implementation of the invention. In this configuration, a window cap 230 is again used to transmit laser light from inside the hermetically enclosed sub-assembly 200. As shown in FIG. 16A, a lid 1605 may be used to seal the sub-mounted lasers after they are inserted in the cover 225 during the manufacturing process. Electrical leads 1625A-N (e.g., made from low cost hermetic glass/metal seal) may be used to provide electrical input to the lasers, which may be part of a laser-sub-mount, such as the sub-mount portion 1010 shown in FIG. 16B. A modulator portion 1005 may then be positioned on an optical bench 105 outside of the sub-assembly 200 to receive the laser light through the window cap 230. As described previously, the modulator portion 1005 may then modulate signals using the light and utilize an interface (not shown) to access an optical network.

Figure 16C:
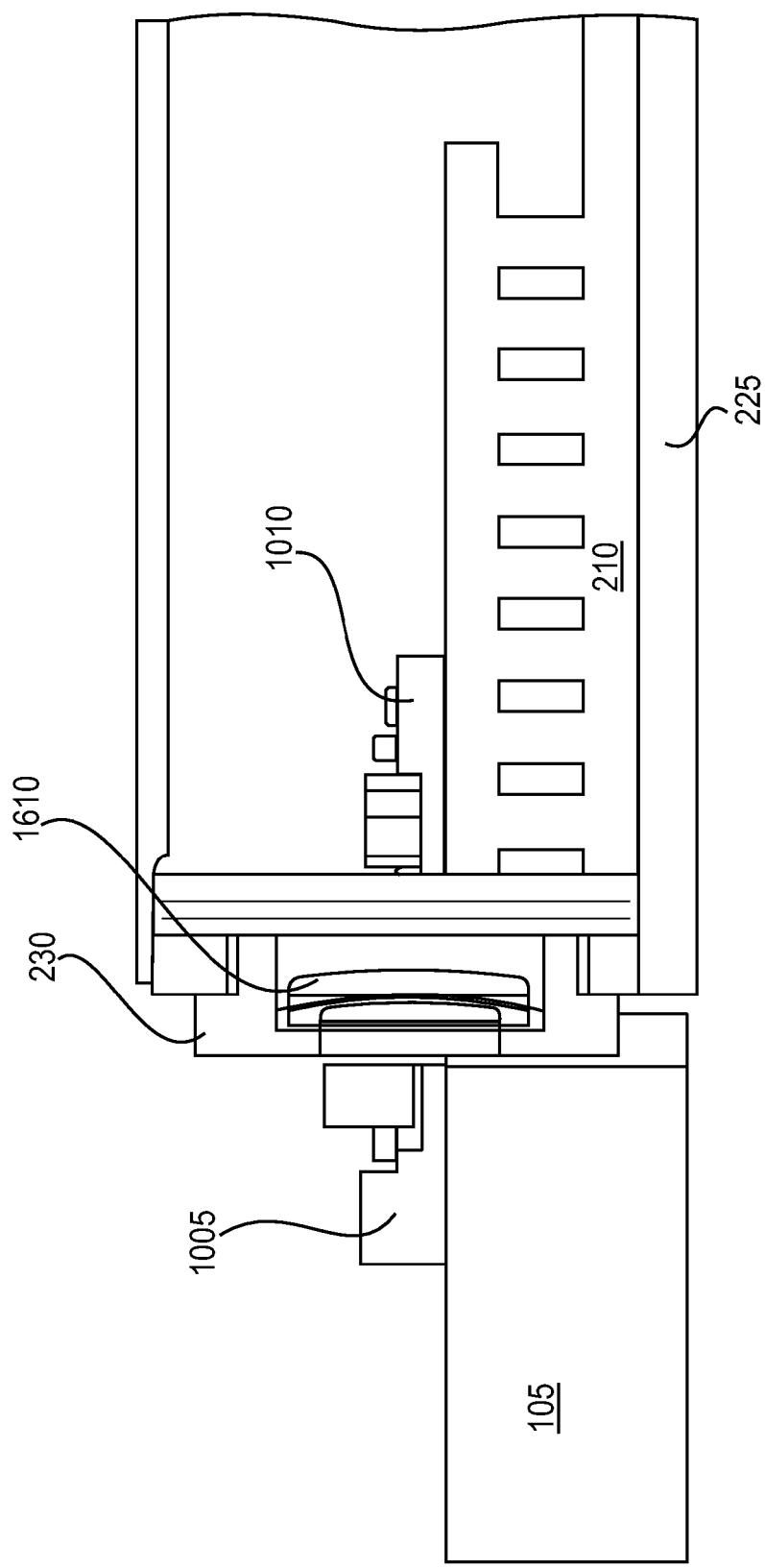
FIG. 16C illustrates a cross-section view of an optical communication device according to another implementation of the invention.

As shown in FIG. 16C, the TEC 210 is horizontal in this implementation, allowing height adjustments to be performed as previously noted with reference to FIGS. 8 through 9. However, in this specific example optical bench 105 can be height adjusted by moving 105 up or down with reference to the optical sub-assembly 200 and, in particular, the window cap 230, which are stationary. Once the right height is found, optical bench/platform 105 can be permanently attached to the hermetically sealed sub-assembly 200 and window cap 230 with laser welding as indicated with arrows in FIG. 16B.

Further, to achieve highest optical coupling, individual lasers 120A-N can be aligned, as a last step, to the modulator 110 rather than using a lens array 1610 like the one shown in FIG. 16A. That way optical misalignment of the multiple collimated beams to each other can be compensated and maximum coupling can be achieved. However, if applications allow for less perfect alignment conditions, then the more efficient lens array 1610 could be used instead.

Alternatively, to recover coupling loss in instances where, for example, optical coupling shifted too much following the window cap weld, an optical flat (or window) may be used in the optical subassembly. This may be beneficial since the window in the window cap may not be perfectly aligned 90-degrees, but may have some random distribution in the range of +/−2 degrees. Such a situation introduces beam walk (vertically to optical beam) in the range of 6 to 7 um. Accordingly, adding an optical flat and tilting it in an opposite way as the random tilt of the window may be used to beneficially recover the coupling loss due to beam walk. As such, a flat window of thickness "h" can be inserted into the collimated beam between the TO and waveguide and the flat window can be tilted and secured to shift the beam by distance "d". In addition, a secondary recovery mode could be used to recover optical tilt introduced by uncontrolled shift during the sub-assembly to platform attachment. In this optional configuration, a single/double wedge/prism could be used to recover loss and bend the collimated beam back to center (similar to that described with reference to the lens array 1610).

Figure 18:
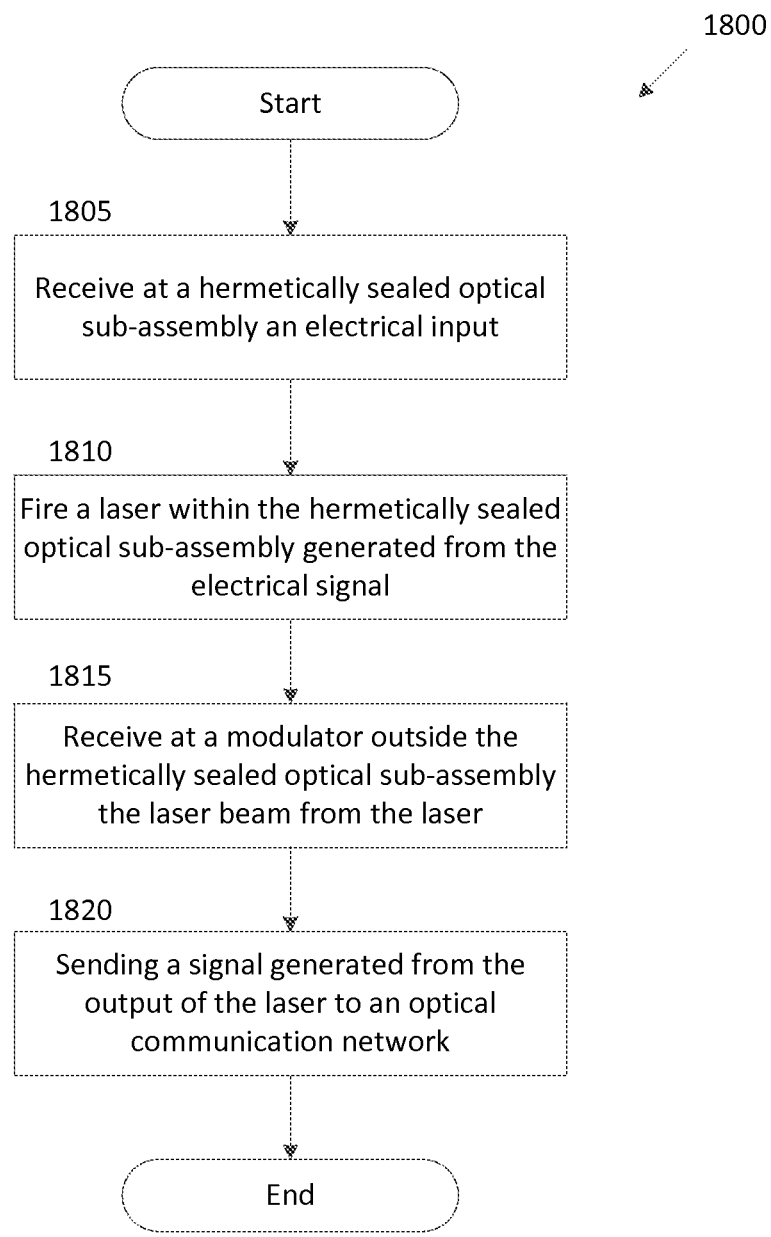
FIG. 18 illustrates a method of using an efficient optical communication device according to one implementation of the invention.

In accordance with the above description, FIG. 18 illustrates an example method 1800 of using an efficient optical device. At step 1805, a hermetically sealed optical sub-assembly receives an electrical input. This input may be generated from an outside source or a source residing at the sub-assembly. At step 1810, one or more lasers are fired within the hermetically sealed optical sub-assembly. As noted herein, this laser or lasers may reside on a sub-mount and be affixed to a thermo-cooler. At step 1815, the laser beam generated from the laser is then received outside the hermetically sealed sub-assembly at a modulator. At this point, the modulator may or may not act on the beam to generate a signal for use in an optical communication network. In either case, however, at step 1820 the beam is directed through the modulator and output to an optical communication network. As noted, any number and type of optical connectors may provide access for the device to communicate with the optical network.

Figure 19:
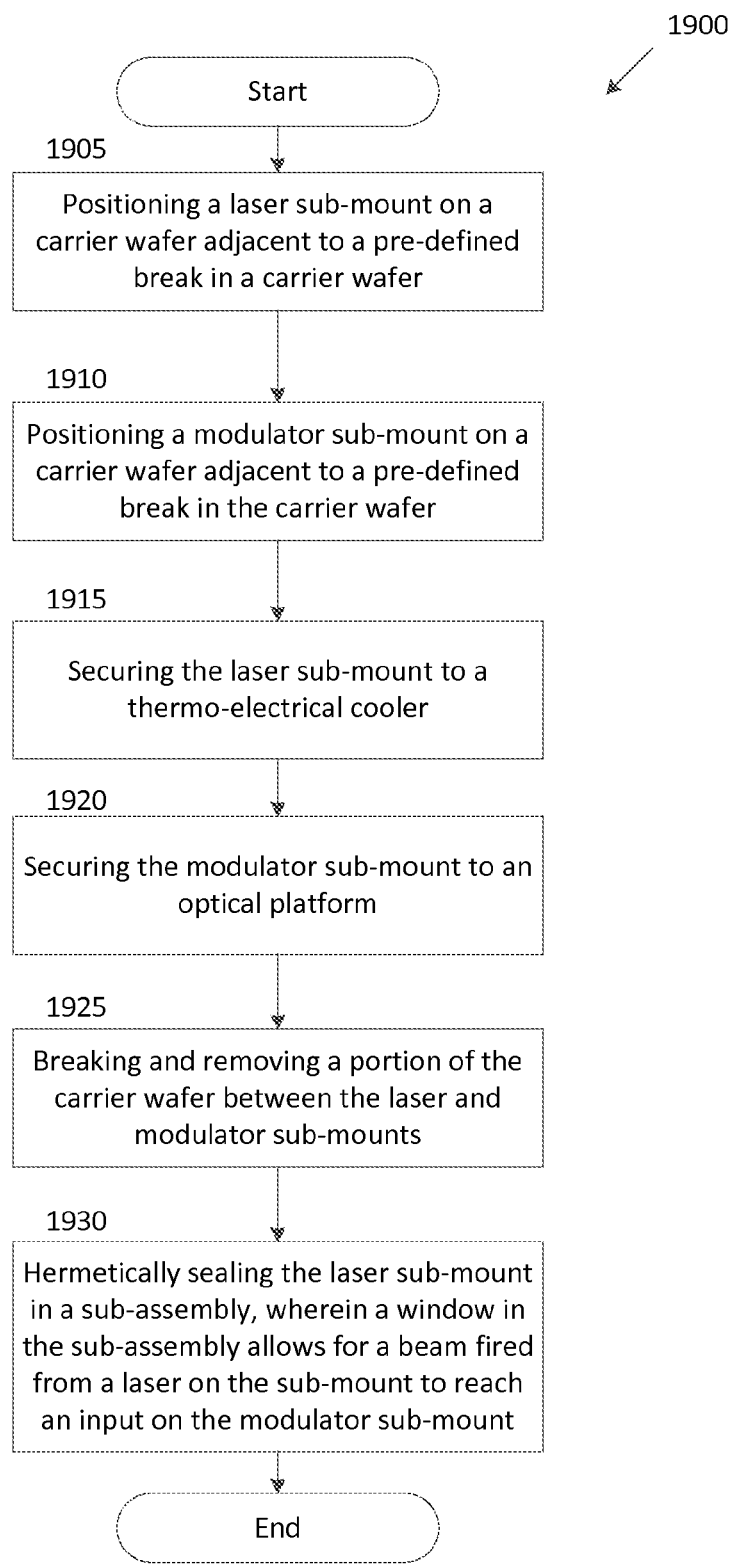
FIG. 19 illustrates a method of manufacturing an optical communication device according to one implementation of the invention.

Further, in accordance with the above described manufacturing process, FIG. 19 provides an example method of manufacturing an optical communication device according to one implementation of the invention. At step 1905, a laser sub-mount is positioned on a carrier wafer adjacent to a first pre-defined break in a carrier wafer. (As noted previously, in another implementation not shown in method 1900, pre-defined breaks may be instead made in a single sub-mount that can carry both a laser portion and a modulator portion in lieu of using a carrier wafer.) At step 1910, a modulator sub-mount is then positioned adjacent to a second pre-defined break in the carrier wafer.

In both instances, the sub-mounts may be glued or otherwise fixably attached to the carrier wafer. Further, to ensure proper alignment before or after adhesion material is applied, a jaw tool or inverted pyramid tool (as disclosed herein) may be used to align the two sub-mounts. After the modulator sub-mount is fixed, the laser-sub-mount (via the carrier wafer or in addition to the carrier wafer) may be secured to a thermo-electrical cooler at step 1915. Likewise, at step 1920, the modulator sub-mount (via the carrier wafer or in addition to the carrier wafer) may be secured to an optical platform to hold the sub-assembly and modulator components in place.

Once these sub-mounts are secured, the portion of the carrier wafer between the two sub-mounts may be broken or cut away and removed at step 1925. As discussed herein, the modulator section may optionally then be removed to allow tooling access to the thermo-electrical cooler and laser sub-mount. In any event, as noted at step 1930, the laser sub-mount and at least a portion of the thermo-electrical cooler is sealed inside a hermetically sealed sub-assembly that contains a window for communicating between the laser sub-mount and modulator sub-mount. In particular, the window allows a laser beam to be fired from a laser on the hermetically sealed sub-mount and received by an input on the modulator that is not hermetically sealed. To achieve this, any of the alignment techniques disclosed herein may be used.

Although the subject matter herein has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method of manufacturing an optical communication device, comprising:
    positioning a first thermally conductive sub-mount configured to accommodate an optical laser on a carrier wafer substantially adjacent to a first pre-defined break line in the carrier wafer;
    positioning a second sub-mount configured to accommodate an optical modulator on the carrier wafer substantially adjacent to a second pre-defined break line in the carrier wafer;
    aligning the first thermally conductive sub-mount in x/y/z directions relative to the second sub-mount in a position to match an optical height of the optical modulator in the z-direction, wherein the z-direction is a vertical direction relative to the carrier wafer;
    securing the first thermally conductive sub-mount to a thermally conductive and electrically non-conductive spacer;
    securing the thermally conductive and electrically non-conductive spacer to a thermo-electrical cooler in a position that defines a gap between the first thermally conductive sub-mount and the thermo-electrical cooler;
    securing the second sub-mount to an optical device platform; and
    removing a portion of the carrier wafer between the first thermally conductive and second sub-mounts.

2. The method of claim 1, further comprising:
    sealing the first thermally conductive sub-mount in a hermetic enclosure; and
    providing a connector in communication with the second sub-mount in order to use the optical communication device in an optical network.

3. The method of claim 2, further comprising:
    ensuring proper coupling of laser beams sent from the first thermally conductive sub-mount to the second sub-mount; and
    adding an optical flat in order to recover coupling loss between the first thermally conductive sub-mount and the second sub-mount.

4. The method of claim 1, further comprising filling the gap with a non-conductive epoxy.

5. The method of claim 1, further comprising adjusting a height of the spacer in the z direction for the aligning of the first thermally conductive sub-mount to the second sub-mount.

6. The method of claim 1, wherein the aligning comprises an alignment in the z-direction via bond line control between the first thermally conductive sub-mount and the optical laser and the second sub-mount and the optical modulator.

7. The method of claim 1, further comprising aligning the first thermally conductive sub-mount and the second sub-mount in the x and y directions that are horizontal directions relative to the carrier wafer using a jaw tool.

8. The method of claim 1 further comprising aligning the first thermally conductive sub-mount and second sub-mount in the x and y directions using an inverted pyramid alignment feature.

9. The method of claim 1, wherein the first thermally conductive sub-mount is configured to accommodate four lasers.

10. The method of claim 9, wherein the first thermally conductive sub-mount is further configured to accommodate an isolator.

11. The method of claim 1, further comprising the step of using a ceramic filled epoxy to attach the portion of the first thermally conductive sub-mount configured to accommodate an optical laser to the thermo-electrical cooler in order to decrease the risk of electrical shortage at the first thermally conductive sub-mount.

* * * * *